(12) United States Patent
Kato et al.

(10) Patent No.: US 9,293,486 B2
(45) Date of Patent: Mar. 22, 2016

(54) IMAGE CAPTURING DEVICE

(71) Applicant: CANON KABUSHIKI KAISHA, Tokyo (JP)

(72) Inventors: Aiko Kato, Machida (JP); Shingo Kitamura, Fujisawa (JP); Takehiro Toyoda, Machida (JP); Hiroaki Naruse, Oita (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/507,656

(22) Filed: Oct. 6, 2014

(65) Prior Publication Data

US 2015/0097219 A1      Apr. 9, 2015

(30) Foreign Application Priority Data

Oct. 9, 2013   (JP) ................................. 2013-212297

(51) Int. Cl.
  *H01L 27/146*     (2006.01)
  *H04N 5/374*      (2011.01)
  (Continued)

(52) U.S. Cl.
  CPC ........ *H01L 27/14603* (2013.01); *H01L 27/124* (2013.01); *H01L 27/146* (2013.01); *H01L 27/1461* (2013.01); *H01L 27/1463* (2013.01); *H01L 27/14605* (2013.01); *H01L 27/14607* (2013.01); *H01L 27/14609* (2013.01); *H01L 27/14612* (2013.01); *H01L 27/14621* (2013.01); *H01L 27/14623* (2013.01); *H01L 27/14627* (2013.01); *H01L 27/14636* (2013.01); *H01L 27/3241* (2013.01); *H01L 27/3246* (2013.01); *H01L 27/3276* (2013.01); *H04N 5/374* (2013.01)

(58) Field of Classification Search
  CPC ... H01L 27/1214; H01L 27/12; H01L 27/124; H01L 27/146; H01L 27/14603; H01L 27/14605; H01L 27/14607; H01L 27/14609; H01L 27/1463; H01L 27/3241; H01L 27/3246; H01L 27/3276; H01L 27/326
  See application file for complete search history.

(56) References Cited

U.S. PATENT DOCUMENTS

| 6,563,187 | B1 * | 5/2003 | Park ............................. | 257/446 |
| 8,809,914 | B2 * | 8/2014 | Suzuki et al. ................. | 257/232 |
| 2002/0079501 | A1 * | 6/2002 | Okada et al. .................... | 257/88 |

(Continued)

FOREIGN PATENT DOCUMENTS

| JP | 2009-94299 A | 4/2009 |
| JP | 2010-232284 A | 10/2010 |

(Continued)

*Primary Examiner* — Eduardo A Rodela
(74) *Attorney, Agent, or Firm* — Canon USA, Inc. IP Division

(57) ABSTRACT

An image capturing device includes an intermediate region located between a pixel circuit region and a peripheral circuit region and forming a boundary with the pixel circuit region and the peripheral circuit region. The pixel circuit region, the peripheral circuit region, and the intermediate region are provided with a semiconductor layer, a first wiring layer on the semiconductor layer, and a second wiring layer located away from the semiconductor layer relative to the first wiring layer. Pixel circuits and a peripheral circuit are connected via one of at least the first wiring layer and the second wiring layer in the intermediate region. The area occupancy of the one wiring layer in the intermediate region relative to a total area thereof is between 0.5 times and 1.5 times the area occupancy of the one wiring layer in the pixel circuit region relative to a total area thereof.

20 Claims, 12 Drawing Sheets

(51) Int. Cl.
*H01L 27/12* (2006.01)
*H01L 27/32* (2006.01)

(56) References Cited

U.S. PATENT DOCUMENTS

2002/0153569 A1* 10/2002 Katayama ..................... 257/351
2009/0239327 A1* 9/2009 Oh et al. ......................... 438/59
2011/0169005 A1* 7/2011 Saito et al. ..................... 257/59
2013/0334641 A1* 12/2013 Suzuki et al. .................. 257/432
2015/0097998 A1* 4/2015 Kato et al. ..................... 348/308

FOREIGN PATENT DOCUMENTS

JP 2011-216865 A 10/2011
JP 2012-204390 A 10/2012

* cited by examiner

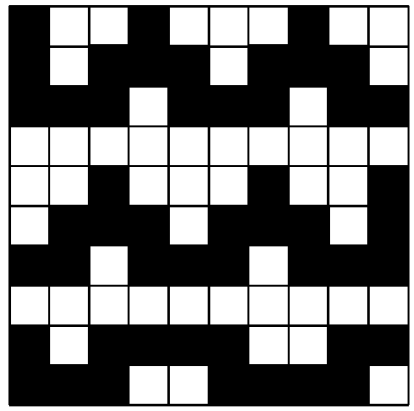
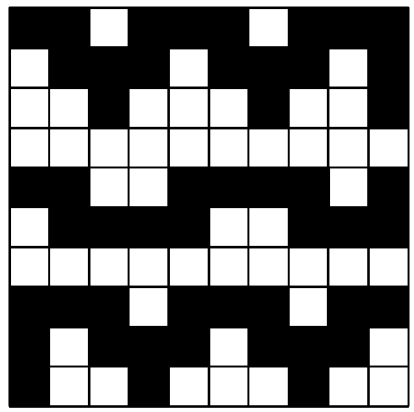
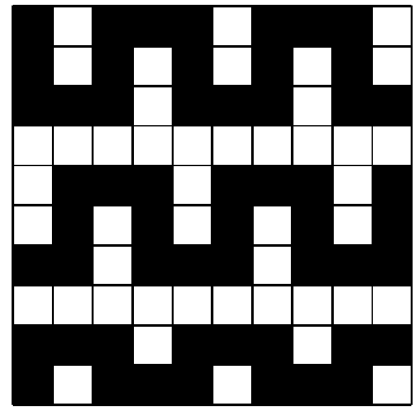

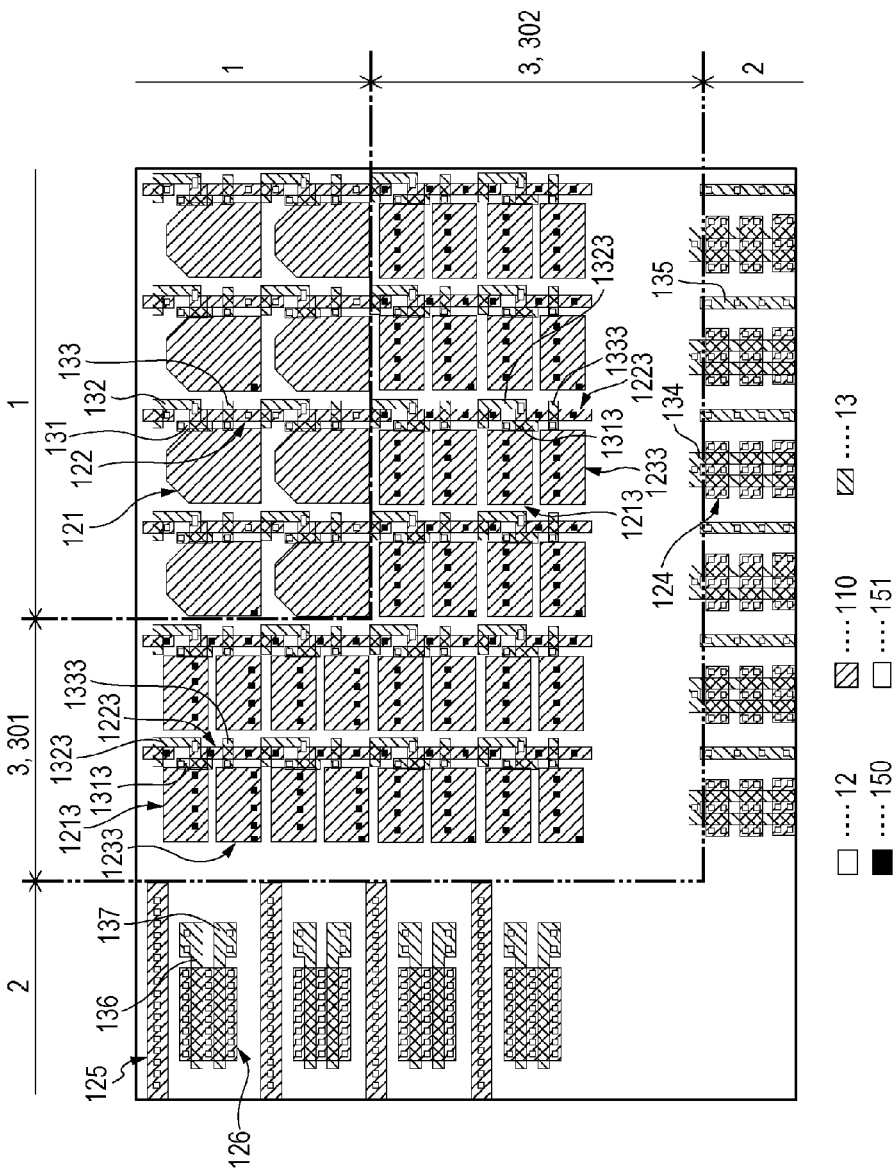

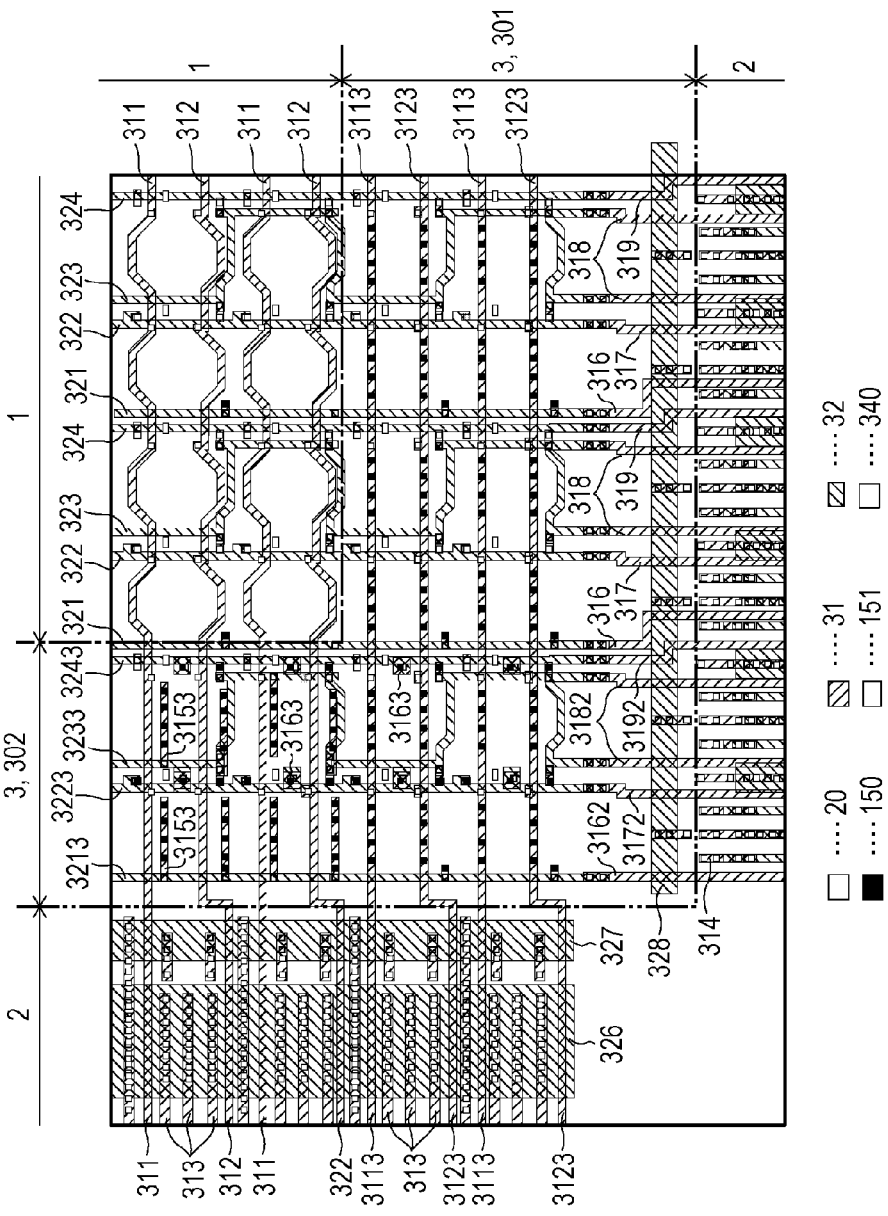

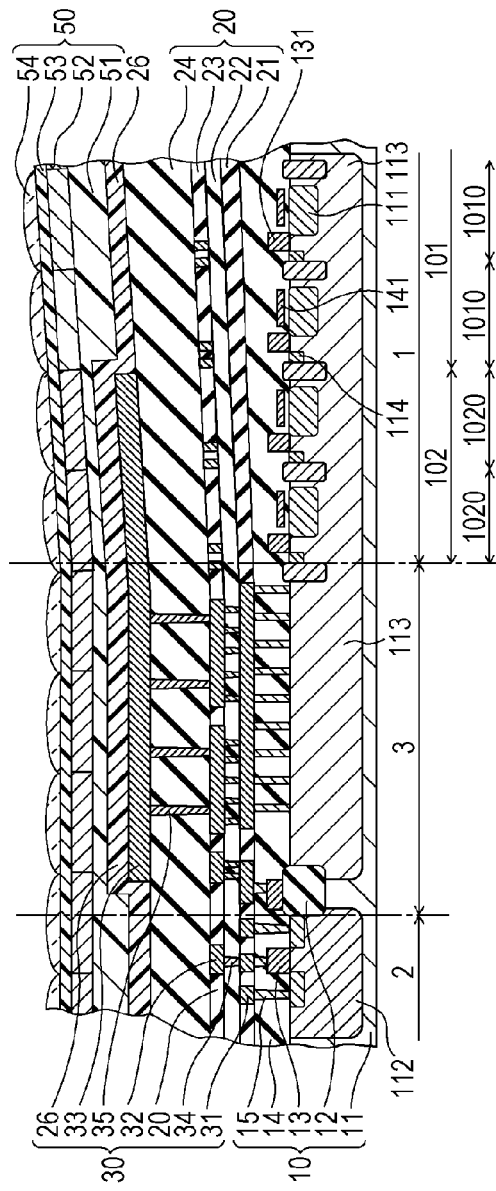
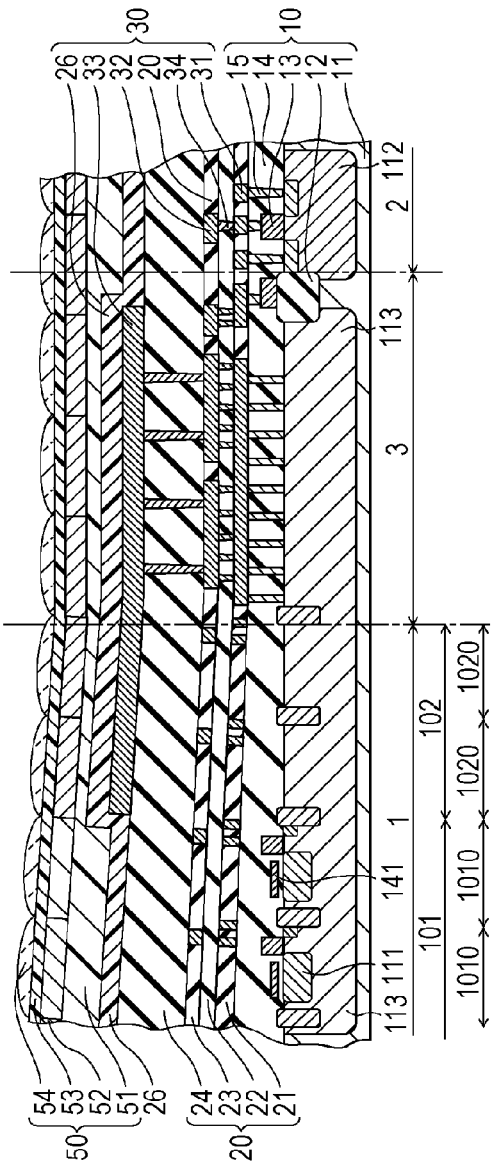
FIG. 7A
FIG. 7B

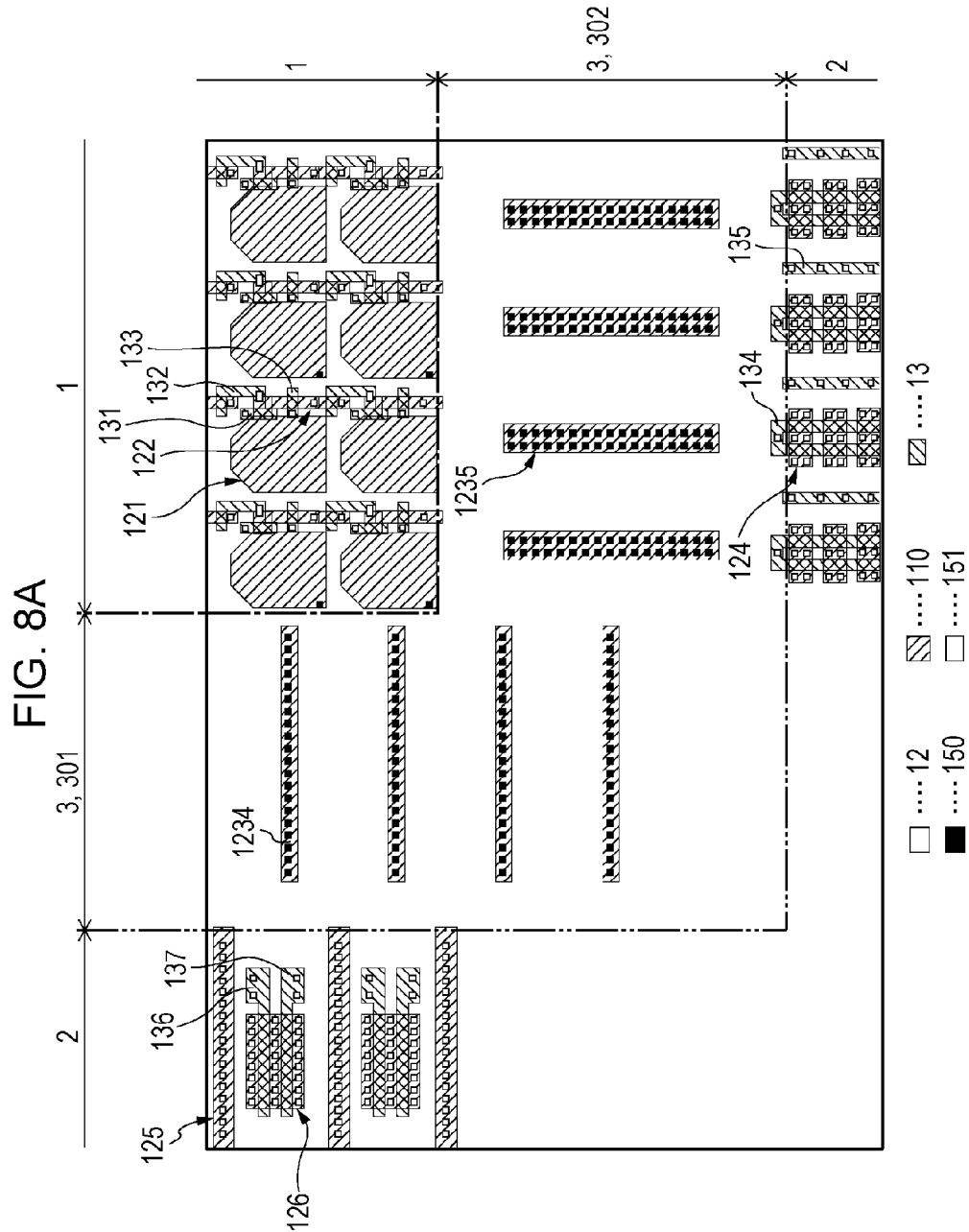

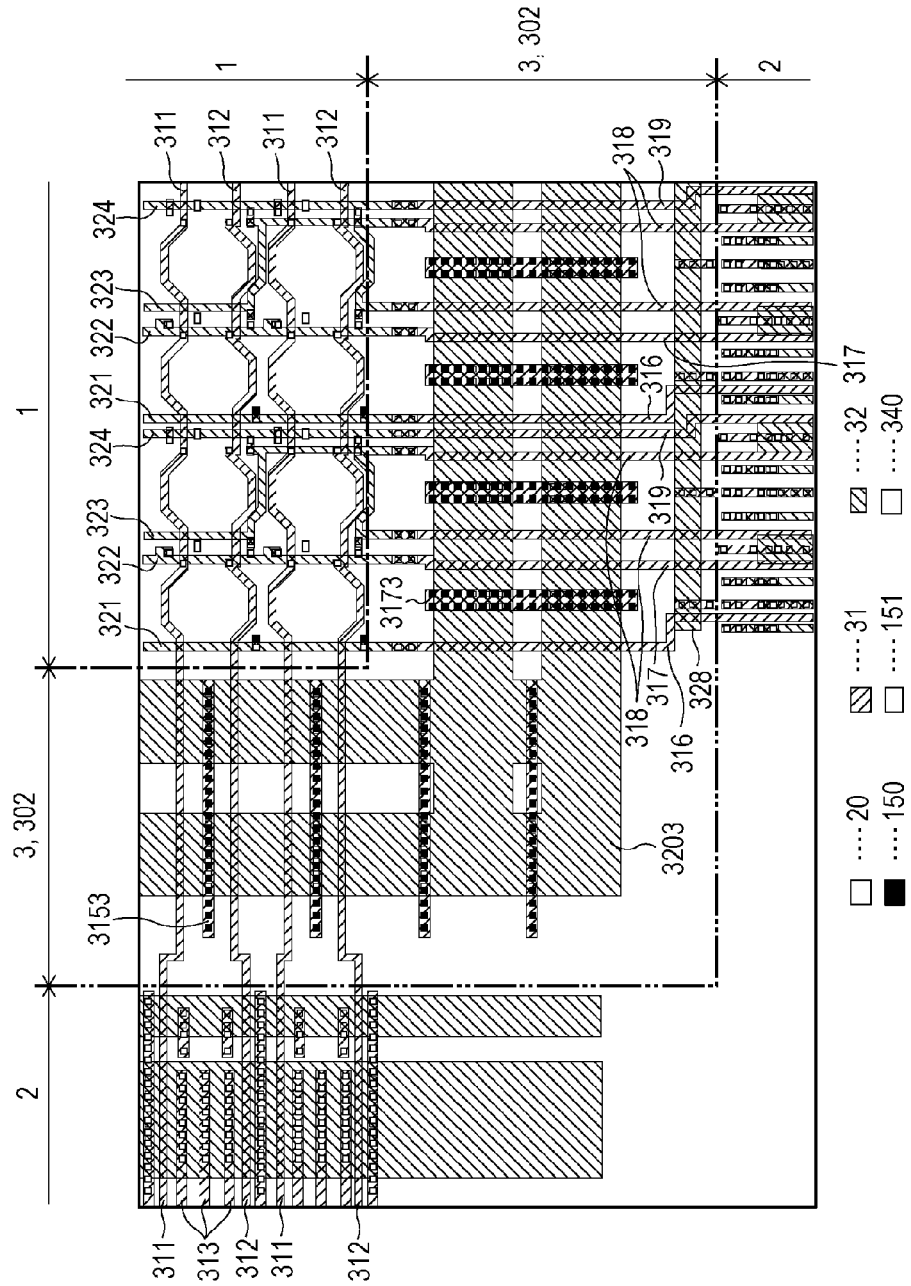

IMAGE CAPTURING DEVICE

BACKGROUND OF THE INVENTION

1. Field of the Invention

One disclosed aspect of the embodiments relates to image capturing devices.

2. Description of the Related Art

An image capturing device, such as a complementary metal-oxide semiconductor (CMOS) image sensor, includes a pixel circuit region in which pixel circuits are arranged and a peripheral circuit region in which peripheral circuits are arranged. Different circuit layouts are employed for the pixel circuit region and the peripheral circuit region. Therefore, with regard to an insulation layer located at the same height as or higher than electrodes and conductive lines, a difference in height may occur between the pixel circuit region and the peripheral circuit region in accordance with the density of the electrodes and the conductive lines. Furthermore, when a planarization process is performed on the insulation layer, there is a problem in that a difference in height may occur between a central part and a peripheral part of the pixel circuit region. A difference in height between the central part and the peripheral part of the pixel circuit region may lead to a difference in signal outputs from the central part and the peripheral part of the pixel circuit region, causing reduction in image quality.

As a countermeasure against this problem, Japanese Patent Laid-Open No. 2009-94299 discusses providing a pixel region with a first layer composed of a transparent material at the same level as at least one of an electrode layer and a wiring layer.

When the first layer is formed in the pixel region as in Japanese Patent Laid-Open No. 2009-94299, damages may occur during the forming process of the first layer or an optical loss may occur due to the existence of the first layer, possibly causing reduction in image quality. Therefore, one disclosed aspect of the embodiments provides an image capturing device that can obtain a higher-quality image.

SUMMARY OF THE INVENTION

According to a first aspect of the embodiments, there is provided an image capturing device including a pixel circuit region in which a plurality of pixel circuits are arranged in a matrix; a peripheral circuit region that is located on a periphery of the pixel circuit region and in which a peripheral circuit is arranged; and an intermediate region that is located between the pixel circuit region and the peripheral circuit region and that forms a boundary with the pixel circuit region and the peripheral circuit region. The pixel circuit region, the peripheral circuit region, and the intermediate region are provided with a semiconductor layer, a first wiring layer located on the semiconductor layer, and a second wiring layer located away from the semiconductor layer relative to the first wiring layer, and the pixel circuits and the peripheral circuit are connected via one of at least the first wiring layer and the second wiring layer in the intermediate region. An area occupancy of the one wiring layer in the intermediate region relative to a total area of the intermediate region is between 0.5 times and 1.5 times an area occupancy of the one wiring layer in the pixel circuit region relative to a total area of the pixel circuit region.

Further features of the disclosure will become apparent from the following description of exemplary embodiments with reference to the attached drawings.

BRIEF DESCRIPTION OF THE DRAWINGS

FIGS. 2A to 2C2 schematically illustrate occupancy and a matching rate.

FIGS. 4A and 4B are schematic plan views illustrating an example of the image capturing device.

FIGS. 7A and 7B are schematic cross-sectional views illustrating an example of the image capturing device.

FIGS. 8A and 8B are schematic plan views illustrating an example of the image capturing device.

DESCRIPTION OF THE EMBODIMENTS

Figure 1:
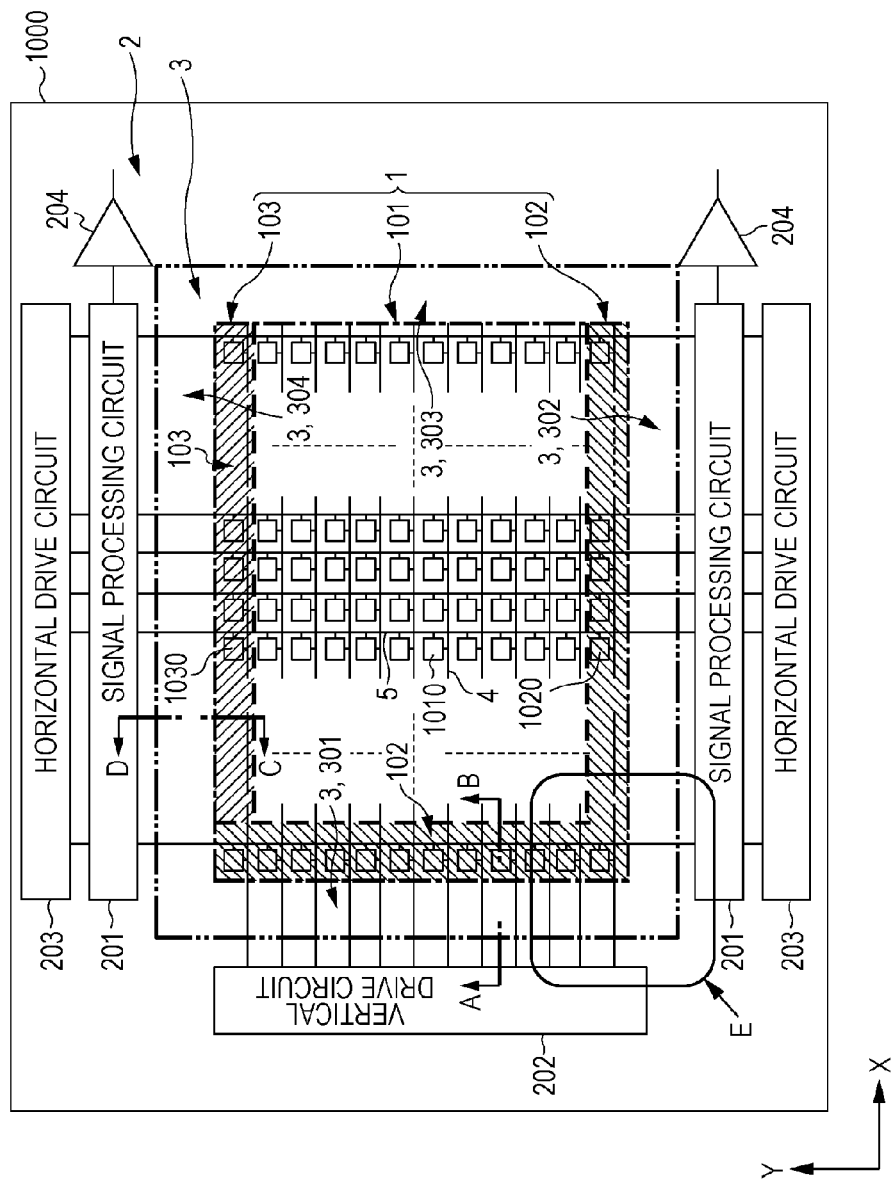
FIG. 1 is a block diagram illustrating an example of an image capturing device.

Embodiments of the disclosure will be described below with reference to the drawings. In the following description and the drawings, there are cases where the description refers to multiple drawings in a mutual manner. Components that are the same among multiple drawings are given the same reference characters, and redundant descriptions of such components given the same reference characters are omitted, where appropriate.

FIG. 1 is a block diagram of an image capturing device 1000. The image capturing device 1000 includes a pixel circuit region 1 in which pixel circuits are arranged, and a peripheral circuit region 2 in which peripheral circuits are arranged. The peripheral circuit region 2 is provided so as to surround the pixel circuit region 1. In this embodiment, the peripheral circuit region 2 is disposed apart from the pixel circuit region 1 such that an intermediate region 3 is located between the pixel circuit region 1 and the peripheral circuit region 2. In FIG. 1, the pixel circuit region 1 is a region surrounded by a single-dotted chain line, the peripheral circuit region 2 is a region between a double-dotted chain line and a solid line, and the intermediate region 3 is a region between the single-dotted chain line and the double-dotted chain line. The intermediate region 3 is located at the peripheral circuit region 2 side relative to the edge of the pixel circuit region 1, and a first end of the intermediate region 3 forms a boundary (corresponding to the single-dotted chain line in FIG. 1) with the edge of the pixel circuit region 1. Moreover, the intermediate region 3 is located at the pixel circuit region 1 side relative to an edge (i.e., inner edge) of the peripheral circuit region 2, and a second end of the intermediate region 3 forms a boundary (corresponding to the double-dotted chain line in FIG. 1) with the peripheral circuit region 2. The single-dotted chain line and the double-dotted chain line indicating these boundaries are also shown in other drawings. The edge of the pixel circuit region 1 includes edges of active regions of semiconductor elements that constitute the pixel circuits of the pixel circuit region 1. The edge of the peripheral circuit region 2 includes edges of active regions of semiconductor elements that constitute the peripheral circuits of the peripheral circuit region 2. The first end of the intermediate region 3 includes an edge of an element isolation region that is adjacent to the active regions of the semiconductor elements constituting the pixel circuits of the pixel circuit region 1. The second end of the intermediate region 3 includes an edge of an element isolation region that is adjacent to the active regions of the semiconductor elements constituting the peripheral circuits of the peripheral circuit region 2. The range of the intermediate region 3 will be described in detail later.

The pixel circuits arranged within the pixel circuit region 1 each have a photoelectric converter and a signal generator that generates an electric signal. The photoelectric converter is provided for each pixel. The signal generator in each pixel circuit includes, for example, a transfer gate, a floating node, an amplification transistor, and a reset transistor. The signal generator may be shared among multiple pixels. In the pixel circuit region 1, multiple pixel circuits are arranged in a matrix. Furthermore, the pixel circuit region 1 is provided with conductive lines (global conductive lines) for connecting the signal generators of the multiple pixel circuits to the individual columns or rows. In FIG. 1, row conductive lines 4 extending in the row direction and column conductive lines 5 extending in the column direction are shown as the global conductive lines. The row direction is a direction in which pixels belonging to the same row are arranged and is also a direction in which multiple columns are arranged. The column direction is a direction in which pixels belonging to the same column are arranged and is also a direction in which multiple rows are arranged. In FIG. 1, the row direction is defined as an X-direction, and the column direction is defined as a Y-direction.

The pixel circuit region 1 at least includes a light-receiving pixel region 101. In the light-receiving pixel region 101, light-receiving pixels 1010 are arranged. The light-receiving pixels 1010 each have a light-receivable photoelectric converter and a signal generator that generates a signal based on an electric carrier of the photoelectric converter. The signals generated by the signal generators in the light-receiving pixels 1010 form an image. In addition to the light-receiving pixel region 101, the pixel circuit region 1 may include at least one of a first reference pixel region 102 and a second reference pixel region 103. In the first reference pixel region 102, first reference pixels 1020 are arranged. The first reference pixels 1020 each have a light-shielded photoelectric converter and a signal generator that generates a signal based on an electric carrier of the photoelectric converter. The first reference pixels 1020 are called, for example, light-shielded pixels, optical black (OB) pixels, or black reference pixels. In the second reference pixel region 103, second reference pixels 1030 are arranged. Each second reference pixel 1030 does not have a photoelectric converter but has a signal generator. The signal generated by the signal generator in each first reference pixel 1020 or each second reference pixel 1030 is used as a reference signal for, for example, reducing noise in the signal obtained by each light-receiving pixel 1010. In contrast to the light-receiving pixels 1010 being pixels that directly form an image, the reference pixels 1020 and 1030 are pixels that indirectly form an image by using an output signal from the reference pixels 1020 and 1030 as a reference signal. The light-receiving pixel region 101 may be referred to as an effective pixel circuit region, and the light-receiving pixels 1010 may be referred to as effective pixels. The first reference pixel region 102 and the second reference pixel region 103 may be generically referred to as non-effective pixel circuit regions, and the first reference pixels 1020 and the second reference pixels 1030 may be generically referred to as non-effective pixels.

The peripheral circuits arranged within the peripheral circuit region 2 include a signal processing circuit 201 for processing signals from the pixel circuits, a drive circuit (vertical drive circuit) 202 for driving the pixel circuits, a drive circuit (horizontal drive circuit) 203 for driving the signal processing circuit 201, and an output circuit 204. The signal processing circuit 201 may include a readout circuit including a constant current source, a correlated double sampling (CDS) circuit, an analog-to-digital converter (ADC) circuit, or an amplification circuit. As a peripheral circuit, a digital-signal processing circuit that processes a digital signal generated by the ADC circuit may be provided.

The intermediate region 3 is provided with, for example, conductive lines for connecting the pixel circuits and the peripheral circuits. Furthermore, the intermediate region 3 is provided with, for example, dummy members that are not components of the pixel circuits or the peripheral circuits. Moreover, the intermediate region 3 is provided with, for example, electrically conductive members (contact plugs) for applying reference potential to the pixel circuits.

As described above, the first reference pixels 1020 and the second reference pixels 1030 are included in the pixel circuit region 1, whereas the intermediate region 3 does not have the light-receiving pixels 1010, the first reference pixels 1020, and the second reference pixels 1030. As will be described later, the intermediate region 3 is desirably provided with structures similar to the effective pixels or non-effective pixels, which are pixels arranged within the pixel circuit region 1. However, these similar structures do not serve as pixels and do not output signals for directly or indirectly forming an image. Even if these similar structures were actually capable of operating as active elements, these active elements do not output signals for directly or indirectly forming an image. In other words, the intermediate region 3 is not provided with active elements that output signals for directly or indirectly forming an image.

In FIG. 1, the intermediate region 3 includes a left region 301 between the first reference pixel region 102 and the vertical drive circuit 202, and a lower region 302 between the first reference pixel region 102 and the signal processing circuit 201. Furthermore, the intermediate region 3 includes a right region 303 opposite from the vertical drive circuit 202 across the light-receiving pixel region 101, and an upper region 304 between the second reference pixel region 103 and the vertical drive circuit 202. Accordingly, the intermediate region 3 has a shape that surrounds the four sides of the pixel circuit region 1 with the left region 301, the lower region 302, the right region 303, and the upper region 304. Although the intermediate region 3 desirably has a rectangular shape, the intermediate region 3 may alternatively be a U-shaped or L-shaped region, or multiple I-shaped regions or a single I-shaped region.

The image capturing device 1000 is a laminated body formed of multiple layers including a semiconductor layer, an insulation layer, and an electrically conductive layer. These layers are provided in the pixel circuit region 1, the peripheral circuit region 2, and the intermediate region 3. This embodiment focuses on a certain layer (also referred to as "specific layer" hereinafter) of these layers, and the layout of this layer is discussed. Specific examples of the layers and the specific layer constituting the image capturing device 1000 will be described later.

The intermediate region 3 can be used as a region for adjusting the difference in denseness and sparseness (i.e., density) of the specific layer in a comparison between the pixel circuit region 1 and the peripheral circuit region 2. Specifically, the specific layer disposed in the pixel circuit region 1 is also disposed in the intermediate region 3 so that the density of the specific layer in the intermediate region 3 is made closer to the density of the specific layer disposed in the pixel circuit region 1. A certain region within each of the pixel circuit region 1, the peripheral circuit region 2, and the intermediate region 3 will be referred to as "specific region" hereinafter.

The denseness and sparseness, that is, the density, of the specific layer can be defined by the occupancy of the specific layer. The occupancy of the specific layer in the specific region is a percentage value obtained by dividing the occupying area of the specific layer in the specific region by the area of the specific region. Specifically, the term "occupancy" in this case refers to area occupancy. The area of the specific region is an area occupied by the specific region within a virtual plane, which is parallel to the surface of the semiconductor layer constituting a light-receiving surface of the photoelectric converter and is located at the same height as the specific layer, and is the total area of the specific region. The occupying area of the specific layer is an area in which the specific layer exists within the specific region. The occupying area of the specific layer corresponds to an area of orthogonal projection of the specific layer relative to the semiconductor layer. The area of the specific region is a sum of the occupying area of the specific layer and the occupying area of another layer (non-specific layer) located at the same height as the specific layer. The non-specific layer is not limited to a single layer and may be multiple kinds of layers.

In order to determine the occupying area of the specific layer, for example, the following method may be employed.

First, square lattice coordinates are applied to the virtual plane where the specific layer is located, and the existence and non-existence of the specific layer in sections corresponding to the coordinates are binarized and allocated. The pitch of the square lattice coordinates may be, for example, about half the minimal width of the specific layer pattern. With regard to the binarization scheme, a threshold scheme may be used. For example, if the specific layer covers half or more of the area of a certain section, it may be determined that the specific layer exists therein. If not, it may be determined that the specific layer does not exist. Alternatively, an error diffusion scheme or an ordered dithering scheme may be used as the binarization scheme.

An example shown in FIG. 2A is a result obtained by dividing the virtual plane where the specific layer is located into 100 sections, that is, 10 by 10 sections, in the pixel circuit region 1 and binarizing the existence and non-existence of the specific layer in each section. The specific layer in the example in FIG. 2A has a pattern constituted of three continuous meandering lines indicated with shaded squares. The blank squares indicate that a non-specific layer exists therein. Likewise, each of examples shown in FIGS. 2B1 and 2B2 is a result obtained by dividing the virtual plane where the specific layer is located into 100 sections, that is, 10 by 10 sections, in the intermediate region 3 and binarizing the existence and non-existence of the specific layer in each section. By dividing the entire specific region into these sections and binarizing them, the occupancy of the specific layer in the specific region can be calculated. FIG. 2B1 illustrates, for example, the pattern of the specific layer in a part of the lower region 302 of the intermediate region 3, and FIG. 2B2 illustrates the pattern of the specific layer in another part of the intermediate region 3, such as a part of the upper region 304 of the intermediate region 3.

It is clear from FIG. 2A that the occupancy of the specific layer in the pixel circuit region 1 is 53%. It is also clear from the patterns shown in FIGS. 2B1 and 2B2 that the occupancy of the specific layer in the intermediate region 3 is 52%. Therefore, the occupancy of the specific layer in the intermediate region 3 is 0.98 times the occupancy of the specific layer in the pixel circuit region 1.

The occupancy of the specific layer in the intermediate region 3 is desirably between 0.5 times and 1.5 times the occupancy of the specific layer in the pixel circuit region 1. In this case, the density of the specific layer in the intermediate region 3 is similar to the density of the specific layer in the pixel circuit region 1. Thus, the flatness of a layer above the specific layer or a non-specific layer located at the same height as the specific layer in the pixel circuit region 1 can be enhanced to a level that satisfies high optical properties required in the image capturing device 1000. With regard to the specific layer, if the occupancy thereof in the intermediate region 3 is below 0.5 times or exceeds 1.5 times the occupancy thereof in the pixel circuit region 1, this implies that the density of the specific layer in the intermediate region 3 is not similar to the density of the specific layer in the pixel circuit region 1. The existence of the specific layer with non-similar densities between the pixel circuit region 1 and the intermediate region 3 significantly lowers the flatness of the non-specific layer, causing the optical properties of the image capturing device 1000 to decrease.

Furthermore, the occupancy of the specific layer in the intermediate region 3 is desirably between 0.7 times and 1.3 times the occupancy of the specific layer in the pixel circuit region 1. In this case, the density of the specific layer in the intermediate region 3 is very similar to the density of the specific layer in the pixel circuit region 1. Moreover, the occupancy of the specific layer in the intermediate region 3 is desirably between 0.9 times and 1.1 times the occupancy of the specific layer in the pixel circuit region 1. In this case, the density of the specific layer in the intermediate region 3 is extremely similar to the density of the specific layer in the pixel circuit region 1. When the occupancy of the specific layer in the intermediate region 3 is 1.0 times the occupancy of the specific layer in the pixel circuit region 1, the occupancy of the specific layer in the intermediate region 3 matches the density of the specific layer in the pixel circuit region 1.

As described above, when the occupancy of the specific layer in the intermediate region 3 is set between 0.5 times and 1.5 times the occupancy of the specific layer in the pixel circuit region 1, an arbitrary pattern can be employed for the planar layout of the specific layer. However, the specific layer desirably has similar planar layouts for the pixel circuit region 1 and the intermediate region 3. Thus, the flatness of a layer above the specific layer or a non-specific layer located at the same height as the specific layer in the pixel circuit region 1 can be enhanced. The degree of similarity in the planar layouts of the specific layer can be defined by a matching rate of the patterns. The following description relates to how a matching rate is calculated.

First, in each of two specific regions for which a matching rate is to be calculated, square lattice coordinates are applied to an appropriate zone of a virtual plane located at the same height as the specific layer so as to divide the zone into multiple sections. The zones applied to the respective specific regions need to have the same contour. Then, the existence and non-existence of the specific layer in sections corresponding to the coordinates are binarized and allocated. Since this method is similar to the above-described method for calculating the occupancy, a description thereof will be omitted.

Subsequently, the pattern of the specific layer in the pixel circuit region 1 is laid over the pattern of the specific layer in the intermediate region 3. For each section (coordinate) in which the relative positions within the zone are equal to each other, it is determined whether or not the patterns match. The number ($N_O$) of sections where the specific layer exists in the pixel circuit region 1 and the specific layer exists in the intermediate region 3 is counted for all the sections. Moreover, the number ($N_X$) of sections where the specific layer does not exist in the pixel circuit region 1 and the specific layer does not exist in the intermediate region 3 is counted. The matching rate is a percentage value obtained by dividing a sum ($N_O+N_X$) of these values by the total number ($N_T$) of the sections and is expressed as $(100\times(N_O+N_X)/N_T)\%$. The number of sections where the specific layer exists in the sections of one of the pixel circuit region 1 and the intermediate region 3 but the specific layer does not exist in the sections of the other one of the two regions is expressed as $N_T-N_O-N_X$.

The two zones that are compared for calculating the matching rate of the specific-layer patterns are selected such that the matching rate of the specific-layer patterns in the two compared zones are maximized. For example, the selection is performed as follows. First, a zone (first zone) in one of the two compared specific regions is selected. Then, from the other one of the two compared specific regions, a zone (second zone) having the highest matching rate with the specific-layer pattern in the first zone is selected. Normally, the second zone having the highest matching rate with the first zone exists at or near a position to which the first zone is parallel-shifted in the row direction or the column direction.

FIG. 2C1 visually illustrates the degree of similarity in the combination of the pattern in FIG. 2A and the pattern in FIG. 2B1, and FIG. 2C2 visually illustrates the degree of similarity in the combination of the pattern in FIG. 2A and the pattern in FIG. 2B2. Sections where the specific layer exists in the pixel circuit region 1 and the specific layer exists in the intermediate region 3 are indicated by "O". Sections where the specific layer does not exist in the pixel circuit region 1 and the specific layer does not exist in the intermediate region 3 are indicated by "X". Sections where the specific layer exists in the pixel circuit region 1 but the specific layer does not exist in the intermediate region 3 are indicated by "A". Sections where the specific layer does not exist in the pixel circuit region 1 but the specific layer exists in the intermediate region 3 are indicated by "B". As described above, the larger the number of O's and X's, the higher the matching rate, meaning that the degree of similarity is higher. In FIG. 2C1, there are 27 sections with O's, 22 sections with X's, 28 sections with A's, and 23 sections with B's, and the matching rate is 49%. In FIG. 2C2, there are 43 sections with O's, 28 sections with X's, 12 sections with A's, and 7 sections with B's, and the matching rate is 91%.

With regard to the specific layer, the higher the matching rate between the pattern in the pixel circuit region 1 and the pattern in the intermediate region 3, the better. If the matching rate is 50% or higher, the patterns are similar to each other. If the matching rate is 70% or higher, the patterns are very similar to each other. Moreover, if the matching rate is 90% or higher, the patterns are extremely similar to each other. If the matching rate is 100%, the patterns match. A high matching rate of the specific-layer patterns in the pixel circuit region 1 and the intermediate region 3 indicates that there is a high possibility of similar occupancy of the specific layer in the two regions. On the other hand, it is clear from the comparison of FIGS. 2B1 and 2B2 relative to FIG. 2A that similar occupancy of the specific layer in the pixel circuit region 1 and the intermediate region 3 does not necessarily mean that the specific-layer patterns are similar to each other. Moreover, a geometrically similar relationship between the pattern in the pixel circuit region 1 and the pattern in the intermediate region 3 does not directly lead to high occupancy or a high matching rate.

The above-described methods for calculating the occupancy and the matching rate are examples. In reality, the occupancy and the matching rate can be readily calculated by a computer-aided design (CAD) system for designing a photo-mask used when manufacturing an image capturing device. Furthermore, the occupancy and the matching rate can also be calculated by a method such as image analysis.

The width of the intermediate region 3, that is, the distance between the pixel circuit region 1 and the peripheral circuit region 2 in the column direction or the row direction, is between 1 μm and 1000 μm. If the distance is extremely small, the advantage of providing the specific layer in the intermediate region 3 is reduced. On the other hand, an extremely large distance would undesirably lead to an increase in size of the image capturing device 1000. A desired range for the width of the intermediate region 3 is between 10 μm and 100 μm. For the width of the intermediate region 3 in the column direction, at least a pitch equivalent to two rows, that is, two or more rows of pixels, in the array of pixels in the pixel circuit region 1 is desirably ensured. Normally, the array pitch of pixels is between 0.5 μm and 5 μm. For the width of the intermediate region 3 in the row direction, at least a pitch equivalent to multiple columns in the array of pixels in the pixel circuit region 1 is desirably ensured. In other words, the width of the intermediate region 3 is desirably larger than a width that is equivalent to two or more columns of pixels. For example, the width of the intermediate region 3 may be set between a width equivalent to 10 columns of pixels and a width equivalent to 100 columns of pixels.

The above-described zone within each of the specific regions for which a matching rate is to be calculated should include a single pixel circuit in the pixel circuit region 1. More desirably, the zone should be larger than or equal to a minimal unit of a repeating pattern. This minimal unit is, for example, a layout corresponding to one pixel, but in a case where a pixel-shared structure is employed, the minimal unit is a layout of multiple pixels. The zones in the compared regions need to have the same contour. If the zone in one of the regions has a rectangular contour while the zone in the other region has a circular contour, a proper matching rate cannot be calculated. The width of the zone within the pixel circuit region 1 for which a matching rate is to be calculated does not exceed the width of the intermediate region 3. For example, it is assumed that, with reference to the width of the intermediate region 3, the zone is smaller than a square zone whose four sides each have the width of the intermediate region 3. Specifically, assuming that the width of the intermediate region 3 is defined as W, a zone that is smaller than or equal to a zone with vertical sides of W and horizontal sides of H may be divided into an appropriate number of sections, and the matching determination process may be performed for each section. For example, it is assumed that the width of the intermediate region 3 is 60 μm, and the width of the specific-layer pattern is 100 nm. In that case, assuming that each section has four 50-nm sides, a 50-μm four-sided zone divided into a total of 1,000,000 sections, that is, 1,000 by 1,000 sections, may be applied to each of the pixel circuit region 1 and the intermediate region 3, and a matching rate may be calculated. It is desirable that the intermediate region 3 have as many zones with a pattern similar to that in the pixel circuit region 1, that is, zones with a matching rate of 50% or higher, as possible. For example, in 50% or higher of the total area of the intermediate region 3, the specific layer desirably has a pattern similar to that in the pixel circuit region 1. It is desirable that the intermediate region 3 surround the pixel circuit region 1 and that the pattern in the pixel circuit region 1 is repeated from the pixel circuit region 1 to the intermediate region 3 in each of the row direction and the column direction.

The occupancy and the matching rate of the layers constituting the image capturing device 1000 have been described above. In addition to the layers, the image capturing device 1000 may include members that extend through the layers. Examples of members extending through the layers include electrically conductive members 15, mentioned above, and dielectric members, which will be described later. Similar to the layers, the occupancy and the matching rate can be defined for each of these members (also referred to as "specific members" hereinafter). In that case, the layers through which the specific members extend act as non-specific layers. The specific members may include a kind of specific member that extends through only a single layer and a kind of specific member that extends through multiple layers.

Next, the structure of the image capturing device 1000 will be described in detail with reference to cross-sectional views and plan views.

Figure 3A:
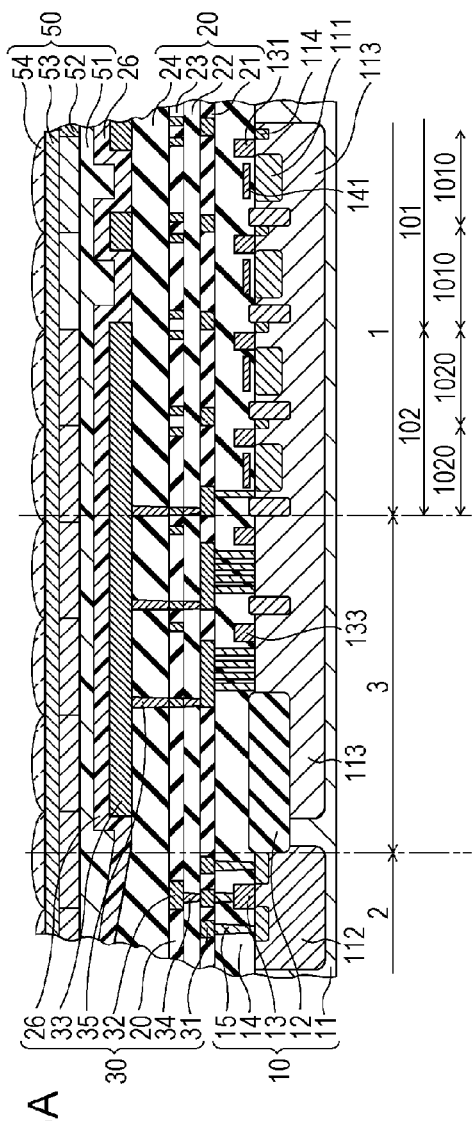
FIGS. 3A and 3B are schematic cross-sectional views illustrating an example of the image capturing device.
Figure 3B:
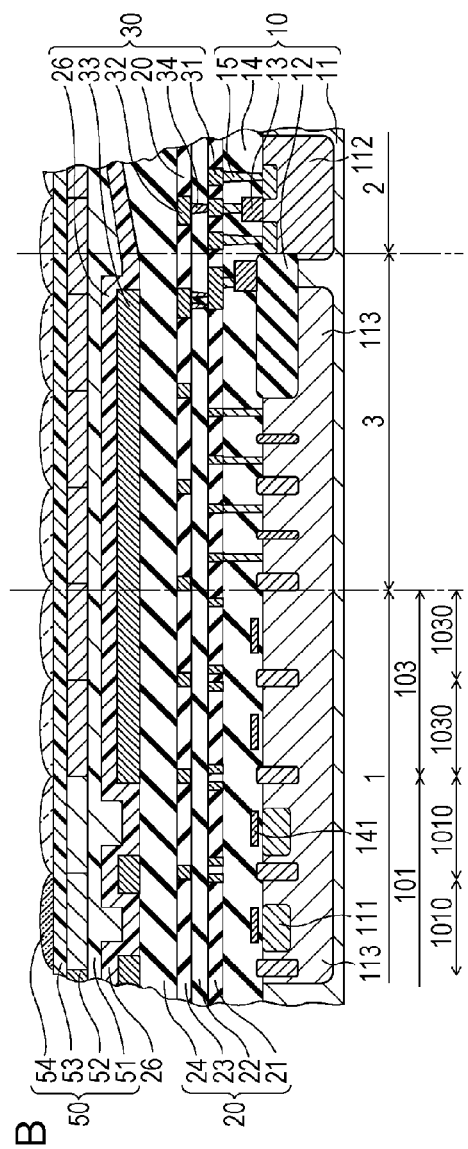

A cross-sectional structure of the image capturing device 1000 according to a first embodiment will now be described. FIG. 3A is a cross-sectional view taken along line A-B in FIG. 1 and illustrates the intermediate region 3, a part of the pixel circuit region 1 in the vicinity of the intermediate region 3, and a part of the peripheral circuit region 2 in the vicinity of the intermediate region 3. The part of the pixel circuit region 1 includes the first reference pixel region 102. FIG. 3B is a cross-sectional view taken along line C-D in FIG. 1 and illustrates the intermediate region 3, a part of the pixel circuit region 1 in the vicinity of the intermediate region 3, and a part of the peripheral circuit region 2 in the vicinity of the intermediate region 3. The part of the pixel circuit region 1 includes the second reference pixel region 103.

The image capturing device 1000 is a laminated body formed of multiple layers extending from the pixel circuit region 1 to the peripheral circuit region 2. The image capturing device 1000 includes an element unit 10, a wiring unit 30, and a light-transmitting unit 50.

The element unit 10 includes a semiconductor layer 11, an element isolation layer 12, an electrode layer 13, an insulation film 14, and the electrically conductive members 15. The insulation film 14 covers the semiconductor layer 11, and the electrically conductive members 15 connected to the semiconductor layer 11 extend through the insulation film 14. Normally, the electrically conductive members 15 are contact plugs. A main material of a contact plug is, for example, tungsten and may contain barrier metal, such as titanium or titanium nitride. The insulation film 14 may be a multilayer film that includes an antireflection layer 141 provided on photoelectric converters 111 and an etching stopper layer (not shown) used when forming the electrically conductive members 15.

The light-receiving pixels 1010 each have a photoelectric converter 111, a transfer gate electrode 131 serving as a gate electrode for the aforementioned transfer gate, and a floating diffusion (FD) region 114 that constitutes the aforementioned floating node. Normally, the photoelectric converters 111 are photodiodes formed within the semiconductor layer 11.

Similarly, the first reference pixels 1020 each have a photoelectric converter 111 and a transfer gate electrode 131. Although only the transfer gate electrodes 131 are shown, gate electrodes for other transistors of the signal generators are also provided on the semiconductor layer 11. The semiconductor layer 11 has a well 113 extending from the pixel circuit region 1 to the intermediate region 3. The well 113 is supplied with reference potential of the pixel circuits via reference contacts 150, which will be described later. The well 113 is, for example, a p-type well. The semiconductor layer 11 has a well 112 in the peripheral circuit region 2. The well 112 is supplied with reference potential of the peripheral circuits. Although the well 112 is, for example, an n-type well, the peripheral circuit region 2 is also provided with a p-type well (not shown).

Gate electrodes are provided above the semiconductor layer 11 via a gate insulation film. Therefore, the upper surfaces of the gate electrodes protrude from the surface of the semiconductor layer 11, causing the surface to be uneven due to the gate electrodes. The electrode layer 13 is an electrically conductive layer (e.g., polysilicon layer) that forms these gate electrodes. The electrode layer 13 is located between the semiconductor layer 11 and the insulation film 14. The electrode layer 13 may include a member other than the gate electrodes and composed of the same material (polysilicon) as the gate electrodes. This member may be used as, for example, a wiring member, a resistor member, or a density adjustment dummy member. The element isolation layer 12 composed of an insulating material is formed along the surface of the semiconductor layer 11 by, for example, local oxidation of silicon (LOCOS), shallow trench isolation (STI), or expanding photodiode area designed for isolation (EDI). The gate insulation film or the element isolation layer 12 is located between the semiconductor layer 11 and the electrode layer 13. The element isolation layer 12 is formed of an insulator that is thicker than the gate insulation film. One or more of the electrically conductive members 15 may be connected to the electrode layer 13.

In each of FIGS. 1, 3A, and 3B, a single-dotted chain line denotes the edge of the pixel circuit region 1 and indicates the boundary between the pixel circuit region 1 and the intermediate region 3. The edge of the pixel circuit region 1 includes all pixel circuits that are included in the multiple pixel circuits and that are located along the edge of the pixel circuit region 1. In the pixel circuit region 1 having m rows by n columns of pixel circuits, the pixel circuits located along the edge include a pixel circuit group that forms a row (first row) at one end of the pixel circuit region 1, a pixel circuit group that forms a row (m-th row) at the other end, a pixel circuit group that forms a column (first column) at one end, and a pixel circuit group that forms a column (n-th column) at the other end. The edge of the pixel circuit region 1 can be defined by four virtual lines that circumscribe the edges of the active regions of the semiconductor elements constituting the pixel circuits of the four pixel circuit groups located along the edge of the pixel circuit region 1. In this case, the pixel circuit region 1 forms a first rectangle.

The edge of the peripheral circuit region 2 can be defined by a virtual line that circumscribes the active regions of multiple semiconductor elements that are included in the peripheral circuits and that are located along an end at the pixel circuit region 1 side. This virtual line may be four lines that are parallel to the lines that define the edge of the pixel circuit region 1. In this case, the inner edge of the peripheral circuit region 2 forms a second rectangle.

The active regions of the semiconductor elements of the pixel circuits and the peripheral circuits are in contact with the element isolation region formed by the element isolation layer 12. Therefore, the edge of the element isolation layer 12 is located at both ends of the intermediate region 3. A region sandwiched between the first rectangle assumed as the inner edge of the intermediate region 3 and the second rectangle assumed as the outer edge of the intermediate region 3 is assumed to be the intermediate region 3. However, if there are pixel circuits and peripheral circuits existing between the first rectangle and the second rectangle, this region is the pixel circuit region 1 or the peripheral circuit region 2 instead of the intermediate region 3. Therefore, a section obtained by excluding a section corresponding to the pixel circuit region 1 or the peripheral circuit region 2 from the region assumed to be the intermediate region 3 is confirmed as the intermediate region 3.

In the edge of the pixel circuit region 1 extending in the row direction or the column direction, the pixel circuit region 1 may partially be adjacent to the peripheral circuit region 2 without the intervention of the intermediate region 3 having an effective width. The effective width of the intermediate region 3 is 1 µm or larger. In a section of the intermediate region 3 where the distance between the pixel circuit region 1 and the peripheral circuit region 2 is smaller than 1 µm, it is considered that the pixel circuit region 1 and the peripheral circuit region 2 are adjacent to each other.

The wiring unit 30 is located above the element unit 10. The wiring unit 30 includes a first wiring layer 31 on the element unit 10, a second wiring layer 32, and a third wiring layer 33. The first wiring layer 31, the second wiring layer 32, and the third wiring layer 33 are electrically conductive layers. The wiring unit 30 further includes an interlayer insulation film 20 that has a first insulation layer 21, a second insulation layer 22, a third insulation layer 23, and a fourth insulation layer 24. Furthermore, the wiring unit 30 also includes a passivation film 26.

Moreover, the wiring unit 30 includes via plugs 34 that connect the first wiring layer 31 and the second wiring layer 32, and via plugs 35 that connect the second wiring layer 32 and the third wiring layer 33. In the light-receiving pixel region 101, the third wiring layer 33 is disposed in a lattice pattern so that the third wiring layer 33 can be used as a light shielding member for defining optical paths in the light-receiving pixels 1010. In the first reference pixel region 102, the third wiring layer 33 functions as a light shielding member that optically shields the photoelectric converters. The first wiring layer 31, the second wiring layer 32, and the third wiring layer 33 are, for example, aluminum layers or copper layers. The wiring layers 31, 32, and 33 may contain barrier metal. The via plugs 34 and 35 are composed of tungsten or copper. The via plugs 34 and 35 may be formed integrally with the second wiring layer 32 and the third wiring layer 33 by using the same material as the second wiring layer 32 and the third wiring layer 33, or may be formed separately from the second wiring layer 32 and the third wiring layer 33 by using a different material.

The first insulation layer 21 is located at the same height as the first wiring layer 31. The second insulation layer 22 is located between the first wiring layer 31 and the second wiring layer 32. The fourth insulation layer 24 is located between the second wiring layer 32 and the third wiring layer 33. In addition to the first to fourth insulation layers 21 to 24, the interlayer insulation film 20 may include a diffusion preventing layer that prevents diffusion of the wiring material, such as copper.

The passivation film 26 includes, for example, a silicon nitride layer and further includes an antireflection layer formed of, for example, a silicon oxynitride layer, where appropriate. The surface of the passivation film 26 may be formed in a shape of a lens so that the passivation film 26 may function as an interlayer lens.

The light-transmitting unit 50 includes a first planarization layer 51, a color filter layer 52, a second planarization layer 53, and a top lens layer 54. Although the color filter layer 52 is a multicolor filter layer having color filters for multiple colors arranged in, for example, a Bayer array, the color filter layer 52 may alternatively be a monochrome filter layer. The first planarization layer 51 and the second planarization layer 53 are formed of, for example, resin layers.

Next, the planar structure of the image capturing device 1000 will be described in detail.

FIG. 4A illustrates an example of the planar layout of the element isolation layer 12 and the electrode layer 13 in a zone surrounded by a solid line E in FIG. 1, in the image capturing device 1000 according to the first embodiment. FIG. 4B illustrates an example of the planar layout of the first wiring layer 31 and the second wiring layer 32 in the zone surrounded by the solid line E in FIG. 1, in the image capturing device 1000 according to the first embodiment.

In FIG. 4A, semiconductor regions 110, which are regions exposed through openings in the element isolation layer 12 of the semiconductor layer 11, are shown in a hatched pattern using oblique lines. The electrode layer 13 is shown in a hatched pattern using oblique lines extending in a direction different from that of the oblique lines used for the hatched pattern of the semiconductor layer 11. Parts where the electrode layer 13 and the semiconductor regions 110 overlap are shown in a hatched pattern using intersecting oblique lines extending in directions different from each other. The semiconductor regions 110 may be active regions but are sometimes not active regions. In the semiconductor regions 110, parts where the electrode layer 13 and the semiconductor regions 110 overlap are where transistor channels are formed.

FIG. 4A illustrates the positions of contacts that connect the semiconductor layer 11 or the electrode layer 13 to the first wiring layer 31. The positions of the contacts correspond to the positions of the electrically conductive members 15. The contacts may include reference contacts 150 and non-reference contacts 151. The reference contacts 150 are connected to the semiconductor layer 11 and supply reference potential to the semiconductor layer 11. The reference contacts 150 will be described later. The non-reference contacts 151 include first-type contacts connected to sources and drains of transistors and second-type contacts connected to gates of the transistors. Furthermore, the non-reference contacts 151 include third-type contacts that connect the semiconductor layer 11 and the electrode layer 13 directly to each other without the intervention of the first wiring layer 31. The third-type contacts are so-called shared contacts.

FIG. 4B illustrates the first wiring layer 31 in a hatched pattern using oblique lines. Furthermore, the second wiring layer 32 is shown in a hatched pattern using oblique lines extending in a direction different from that of the oblique lines used for the hatched pattern of the first wiring layer 31. Parts where the first wiring layer 31 and the second wiring layer 32 overlap are shown in a hatched pattern using intersecting oblique lines extending in directions different from each other. Accordingly, the parts where the first wiring layer 31 and the second wiring layer 32 overlap are where the via plugs 34 that connect the first wiring layer 31 and the second wiring layer 32 may exist.

FIG. 4B illustrates the positions of via plugs 34 that connect the first wiring layer 31 and the second wiring layer 32. In FIG. 4B, the positions of the non-reference contacts 151 and the reference contacts 150 that connect the semiconductor layer 11 or the electrode layer 13 to the first wiring layer 31 are also shown.

The positions of the contacts in FIG. 4A correspond to the positions of the contacts in FIG. 4B. Based on this correspondence relationship of the contacts, the positional relationships among the wiring layers 31 and 32, the element isolation layer 12, and the electrode layer 13 are comprehensible.

The configurations of the element isolation layer 12, the electrode layer 13, and the electrically conductive members 15 described in FIGS. 3A and 3B will now be described with reference to FIG. 4A.

The element isolation layer 12 provided in the pixel circuit region 1 has a pattern that exposes the semiconductor regions 110 of the semiconductor layer 11. The pattern of the element isolation layer 12 includes first-type openings 121 for defining the active regions provided with the photoelectric converters 111 in the semiconductor layer 11. Furthermore, the pattern of the element isolation layer 12 also includes second-type openings 122 for defining the active regions provided with the sources, drains, and channels of the transistors of the pixel circuits in the semiconductor layer 11. The first-type openings 121 have an area larger than that of the second-type openings 122. In this example, transfer transistors are formed astride the active regions defined by the first-type openings 121 and the second-type openings 122. Reset transistors are formed in the active regions defined by the second-type openings 122. On the other hand, amplification transistors are formed in the active regions defined by the second-type openings 122 that define the active regions of the reset transistors of other pixels. In each pixel, the first-type opening 121 and the second-type opening 122 extend continuously so as to form a single opening. Alternatively, each pixel may include multiple openings constituted of a first-type opening and a second-type opening that are separated from each other. As another alternative, a single continuous opening may be provided across multiple pixels.

The element isolation layer 12 provided in the intermediate region 3 has a pattern that exposes the semiconductor regions 110 of the semiconductor layer 11. The pattern of the element isolation layer 12 includes first-type openings 1213 for defining first-type regions in the semiconductor layer 11. Furthermore, the pattern of the element isolation layer 12 also includes second-type openings 1223 for defining second-type regions, which have an area smaller than that of the first-type regions, in the semiconductor layer 11. In the first embodiment shown in FIG. 4A, the pattern of the element isolation layer 12 further includes third-type openings 1233 for defining third-type regions, which have an area smaller than that of the second-type regions, in the semiconductor layer 11. In the first embodiment (FIG. 4A), the sum of the area of each first-type opening 1213 and the area of each third-type opening 1233 in the intermediate region 3 is about the same as the area of each first-type opening 121 in the pixel circuit region 1. In this example, the shape of each second-type opening 122 is identical to (the same as) the shape of each second-type opening 1223.

The positional relationship between the first-type openings 1213 and the second-type openings 1223 in the intermediate region 3 is similar to the positional relationship between the first-type openings 121 and the second-type openings 122 in the pixel circuit region 1. In this example, these positional relationships are identical to each other. Furthermore, the intermediate region 3 is provided with a plurality of opening groups constituted of the first-type openings 1213 and the second-type openings 1223. The positional relationship (array cycle) among these opening groups and the positional relationship (array cycle) among the opening groups in the pixel circuit region 1 are similar to each other. In this example, these positional relationships (array cycles) are identical between the pixel circuit region 1 and the intermediate region 3.

The element isolation layer 12 provided in the peripheral circuit region 2 has a pattern that includes openings 124, 125, and 126 for defining the active regions of the transistors constituting the peripheral circuits. The pattern of the element isolation layer 12 in the peripheral circuit region 2 is not similar to the pattern of the element isolation layer 12 in the pixel circuit region 1 or the pattern of the element isolation layer 12 in the intermediate region 3.

The electrode layer 13 provided in the pixel circuit region 1 has gate electrode groups. Each gate electrode group includes a transfer gate electrode 131, an amplification gate electrode 132, and a reset gate electrode 133. The amplification gate electrode 132 is a gate electrode for an amplification transistor, and the reset gate electrode 133 is a gate electrode for a reset transistor. Multiple gate electrode groups are provided in the pixel circuit region 1. These gate electrode groups constitute the signal generators for the respective photoelectric converters in the pixel circuit region 1.

The electrode layer 13 provided in the intermediate region 3 includes first-type dummy electrodes 1313, second-type dummy electrodes 1323, and third-type dummy electrodes 1333. Each first-type dummy electrode 1313 has a shape similar to that of each transfer gate electrode 131 in the pixel circuit region 1. The first-type dummy electrodes 1313 are also shown in FIG. 3A. As shown in FIG. 4A, in this example, the shape of each first-type dummy electrode 1313 is identical to (the same as) the shape of each transfer gate electrode 131. Each second-type dummy electrode 1323 has a shape similar to that of each amplification gate electrode 132 in the pixel circuit region 1. In this example, the shape of each second-type dummy electrode 1323 is identical to (the same as) the shape of each amplification gate electrode 132. In this example, the shape of each third-type dummy electrode 1333 is identical to (the same as) the shape of each reset gate electrode 133. Furthermore, the positional relationship among the first-type to third-type dummy electrodes 1313, 1323, and 1333 in the intermediate region 3 is similar to the positional relationship among the gate electrodes 131, 132, and 133 in the pixel circuit region 1. In this example, these positional relationships are identical to each other. Furthermore, the intermediate region 3 is provided with multiple dummy electrode groups constituted of the first-type to third-type dummy electrodes 1313, 1323, and 1333. The positional relationship among these multiple dummy electrode groups and the positional relationship among the multiple gate electrode groups are similar to each other. In this example, these positional relationships are identical to each other.

The electrode layer 13 provided in the peripheral circuit region 2 constitutes gate electrodes 134 for the transistors constituting the peripheral circuits. Each gate electrode 134 constitutes a gate of, for example, a complementary metal-oxide semiconductor (CMOS) circuit. Alternatively, each gate electrode 134 may be formed as an integral component functioning as a gate electrode for an re-channel metal-oxide semiconductor (NMOS) transistor, a gate electrode for a p-channel metal-oxide semiconductor (PMOS) transistor, and a conductive line that connects these gate electrodes. Furthermore, the electrode layer 13 in the peripheral circuit region 2 may have a structure different from those of the pixel circuit region 1 and the intermediate region 3. For example, the electrode layer 13 in the peripheral circuit region 2 may have a polycide structure whose lower part is composed of polysilicon and upper part is composed of silicide.

Next, the configurations of the wiring layers 31 and 32 described in FIGS. 3A and 3B will now be described with reference to FIG. 4B.

First, the configuration of the electrically conductive layers in the pixel circuit region 1 will be described. The first wiring layer 31 and the second wiring layer 32 constitute global conductive lines that extend across the pixel circuit region 1.

The global conductive lines in the pixel circuit region 1 include transfer signal lines 311 and reset signal lines 312 each extending in the row direction. The global conductive lines also include reference signal lines 321, odd-numbered-column output signal lines 322, power supply lines 323, and even-numbered-column output signal lines 324. The transfer signal lines 311, the reset signal lines 312, the odd-numbered-column output signal lines 322, and the even-numbered-column output signal lines 324, excluding the power supply lines 323 and the reference signal lines 321, will collectively be referred to as signal lines.

The transfer signal lines 311 transmit transfer signals (TX) for on-off controlling the transfer gates in the pixel circuit region 1. The reset signal lines 312 transmit reset signals (RS) for on-off controlling the reset transistors in the pixel circuit region 1. The reference signal lines 321 transmit reference potential (GND) to be applied to the semiconductor layer 11 in the pixel circuit region 1. The odd-numbered-column output signal lines 322 transmit signals (PX1) from image signal generators in odd-numbered columns. The power supply lines 323 transmit power supply potential (VDD) to be applied to well regions of the semiconductor layer 11. The even-numbered-column output signal lines 324 transmit signals (PX2) from image signal generators in even-numbered columns.

In the pixel circuit region 1, the transfer signal lines 311 and the reset signal lines 312 serving as the global conductive lines are mainly constituted by the first wiring layer 31. Furthermore, in the pixel circuit region 1, the reference signal lines 321, the odd-numbered-column output signal lines 322, the power supply lines 323, and the even-numbered-column output signal lines 324 also serving as the global conductive lines are mainly constituted by the second wiring layer 32. In the pixel circuit region 1, local conductive lines for connecting the global conductive lines constituted by the first wiring layer 31 to the semiconductor layer 11 are constituted by the first wiring layer 31.

With regard to the global conductive lines (row conductive lines) constituted by the first wiring layer 31, the transfer signal lines 311 and the reset signal lines 312 each have a meandering shape and have a substantially symmetrical shape with respect to the pixels. Furthermore, the global conductive lines constituted by the first wiring layer 31 have a positional relationship in which the transfer signal lines 311 and the reset signal lines 312 are arranged repetitively in this order.

With regard to the global conductive lines constituted by the second wiring layer 32, the reference signal lines 321, the odd-numbered-column output signal lines 322, and the even-numbered-column output signal lines 324 each have a substantially linear shape, whereas the power supply lines 323 have a meandering shape. The reference signal lines 321, the odd-numbered-column output signal lines 322, the power supply lines 323, and the even-numbered-column output signal lines 324 have a positional relationship in which they are arranged repetitively in this order.

Next, the configuration of the wiring layers in the peripheral circuit region 2 will be described. In the peripheral circuit region 2, the transfer signal lines 311 and the reset signal lines 312 are constituted by the first wiring layer 31, as in the pixel circuit region 1. The first wiring layer 31 is used for local conductive lines 313 for circuits provided for the respective rows in the vertical drive circuit. The second wiring layer 32 is used for global conductive lines 326 and 327 that connect the circuits provided for the respective rows.

The peripheral circuit region 2 is provided with reference signal lines 316 connected to the reference signal lines 321, odd-numbered-column output signal lines 317 connected to the odd-numbered-column output signal lines 322, power supply lines 318 connected to the power supply lines 323, and even-numbered-column output signal lines 319 connected to the even-numbered-column output signal lines 324. Unlike the pixel circuit region 1, the reference signal lines 316, the odd-numbered-column output signal lines 317, the power supply lines 318, and the even-numbered-column output signal lines 319 are constituted by the first wiring layer 31. The first wiring layer 31 is used for local conductive lines 314 for circuits provided for the respective columns in the signal processing circuit. The second wiring layer 32 is used for global conductive lines 328 that connect the circuits provided for the respective columns.

Next, the configurations of the electrically conductive layers, such as the first wiring layer 31 and the second wiring layer 32, in the intermediate region 3 will be described. In the following description of the intermediate region 3, the left region 301 located between the pixel circuit region 1 and the vertical drive circuit 202 and the lower region 302 located between the pixel circuit region 1 and the signal processing circuit 201 will be described separately.

The transfer signal lines 311 and the reset signal lines 312 extend through the left region 301 so as to transmit signals (TX and RS) from the vertical drive circuit. In the intermediate region 3, the transfer signal lines 311 and the reset signal lines 312 are constituted by the first wiring layer 31, as in the pixel circuit region 1. However, in the first embodiment, the transfer signal lines 311 and the reset signal lines 312 in the left region 301 each have a linear shape, unlike the meandering shape as in the pixel circuit region 1.

Furthermore, in the left region 301, four types of reference signal lines, namely, a first-type reference signal line 3213, a second-type reference signal line 3223, a third-type reference signal line 3233, and a fourth-type reference signal line 3243, are provided as global conductive lines that extend across the intermediate region 3 in the column direction. The first-type reference signal line 3213, the second-type reference signal line 3223, the third-type reference signal line 3233, and the fourth-type reference signal line 3243 are constituted by the second wiring layer 32 shown in the cross-sectional views in FIGS. 3A and 3B.

The first-type reference signal line 3213 has a similar shape and the same positional relationship as the reference signal lines 321 in the pixel circuit region 1. The second-type reference signal line 3223 has a similar shape and the same positional relationship as the odd-numbered-column output signal lines 322 in the pixel circuit region 1. The third-type reference signal line 3233 has a similar shape and the same positional relationship as the power supply lines 323 in the pixel circuit region 1. The fourth-type reference signal line 3243 has a similar shape and the same positional relationship as the even-numbered-column output signal lines 324 in the pixel circuit region 1. Specifically, the first-type reference signal line 3213, the second-type reference signal line 3223, and the fourth-type reference signal line 3243 each have a linear shape, whereas the third-type reference signal line 3233 has a meandering shape. The first-type reference signal line 3213, the second-type reference signal line 3223, the third-type reference signal line 3233, and the fourth-type reference signal line 3243 have a positional relationship in which they are arranged in this order. Therefore, the density of the second wiring layer 32 and the planar layout of the second wiring layer 32 are similar between the pixel circuit region 1 and the intermediate region 3.

In the intermediate region 3, the first-type reference signal line 3213 and the second-type reference signal line 3223 that are constituted by the second wiring layer 32 are respectively connected to a first-type reference signal line 3162 and a second-type reference signal line 3172 constituted by the first wiring layer 31 in the peripheral circuit region 2. In the intermediate region 3, the third-type reference signal line 3233 and the fourth-type reference signal line 3243 constituted by the second wiring layer 32 are respectively connected to a third-type reference signal line 3182 and a fourth-type reference signal line 3192 constituted by the first wiring layer 31 in the peripheral circuit region 2. In the left region 301, the first-type reference signal line 3213, the second-type reference signal line 3223, the third-type reference signal line 3233, and the fourth-type reference signal line 3243 that are constituted by the second wiring layer 32 intersect with the transfer signal lines 311 and the reset signal lines 312 constituted by the first wiring layer 31 at multiple locations.

The first-type reference signal line 3213, the second-type reference signal line 3223, the third-type reference signal line 3233, and the fourth-type reference signal line 3243 transmit reference signals (GND) for applying reference potential to the semiconductor layer 11 in the left region 301 of the intermediate region 3.

In the lower region 302, the reference signal lines 321, the odd-numbered-column output signal lines 322, the power supply lines 323, and the even-numbered-column output signal lines 324 extend so as to transmit signals (GND, VDD, PX1, and PX2) from the horizontal drive circuit. In the intermediate region 3, the reference signal lines 321, the odd-numbered-column output signal lines 322, the power supply lines 323, and the even-numbered-column output signal lines 324 are constituted by the second wiring layer 32, as in the pixel circuit region 1. In the first embodiment, the power supply lines 323 in the lower region 302 have a meandering shape, as in the pixel circuit region 1.

The reference signal lines 321 and the odd-numbered-column output signal lines 322 that are constituted by the second wiring layer 32 in the lower region 302 are respectively connected to the reference signal lines 316 and the odd-numbered-column output signal lines 317 constituted by the first wiring layer 31 in the peripheral circuit region 2. The power supply lines 323 and the even-numbered-column output signal lines 324 that are constituted by the second wiring layer 32 in the lower region 302 are respectively connected to the power supply lines 318 and the even-numbered-column output signal lines 319 in the peripheral circuit region 2.

Furthermore, in the lower region 302, two types of reference signal lines, namely, fifth-type reference signal lines 3113 and sixth-type reference signal lines 3123, are provided as global conductive lines that extend across the intermediate region 3 in the row direction. The fifth-type reference signal lines 3113 are spaced apart from each other by a distance equal to the distance between the transfer signal lines 311 in the pixel circuit region 1. The sixth-type reference signal lines 3123 are spaced apart from each other by a distance equal to the distance between the reset signal lines 312 in the pixel circuit region 1. In contrast to the transfer signal lines 311 and the reset signal lines 312 each having a meandering shape in the pixel circuit region 1, the fifth-type reference signal lines 3113 and the sixth-type reference signal lines 3123 each have a linear shape. In the lower region 302, the fifth-type reference signal lines 3113 and the sixth-type reference signal lines 3123 that are constituted by the first wiring layer 31 intersect with the reference signal lines 316, the odd-numbered-column output signal lines 317, the power supply lines 318, and the even-numbered-column output signal lines 319 constituted by the first wiring layer 31 at multiple locations. In a connection area between the left region 301 and the lower region 302, the reference signal lines 3113 and 3123 constituted by the first wiring layer 31 intersect with the reference signal lines 3213, 3223, 3233, and 3243 constituted by the second wiring layer 32 at multiple locations.

The fifth-type reference signal lines 3113 and the sixth-type reference signal lines 3123 transmit reference signals (GND) for applying reference potential to the semiconductor layer 11 in the lower region 302 of the intermediate region 3.

The pixel circuit region 1 and the intermediate region 3 may be provided with the reference contacts 150 for applying reference potential to the semiconductor layer 11. The reference potential is also called well potential or body potential and is normally ground potential. As shown in FIGS. 3A and 3B, the reference contacts 150 are formed by the electrically conductive members 15, such as contact plugs, provided in the intermediate region 3 and can be achieved by connecting reference-potential supplying conductive lines to the electrically conductive members 15. In this case, the third wiring layer 33 that extends over a wide range as a light shielding member is used as the conductive lines and applies reference potential to the electrically conductive members 15 via the second wiring layer 32 and the first wiring layer 31. As shown in FIG. 4A, the intermediate region 3 surrounding the pixel circuit region 1 is provided with a large number of reference contacts 150 so that a large number of reference contacts 150 that surround the pixel circuit region 1 can be provided. Therefore, a difference in reference potential between the central part and the peripheral part of the pixel circuit region 1 can be suppressed, thereby reducing shading. The reference contacts 150 are provided via local conductive lines 3153 that are constituted by the first wiring layer 31 and that are connected to the first-type reference signal line 3213 and the third-type reference signal line 3233 constituted by the second wiring layer 32. The reference contacts 150 are also provided via local conductive lines 3163 connected to the second-type reference signal line 3223 and the fourth-type reference signal line 3243.

The pixel circuit region 1 may also be provided with the reference contacts 150. However, because the reference contacts 150 may act as noise sources, the smaller the number of reference contacts 150 in the pixel circuit region 1, the better. For example, one reference contact 150 may be provided for every three or more pixels. This may imply that, for three kinds of pixels that receive light rays of the three primary colors, such as red, green, and blue colors, a corresponding reference contact 150 is provided close to at least two kinds of pixels. For example, it is assumed that the distance from a pixel B that receives a light ray with a first wavelength to a reference contact 150 that is the closest to the pixel B is defined as $L_B$. Furthermore, it is assumed that the distance from a pixel G that receives a light ray with a second wavelength to a reference contact 150 that is the closest to the pixel G is defined as $L_G$. Moreover, it is assumed that the distance from a pixel R that receives a light ray with a third wavelength to a reference contact 150 that is the closest to the pixel R is defined as $L_R$. In this case, the pixel R, the pixel G, and the pixel B are adjacent to one another. By providing one reference contact 150 for every three or more adjacent pixels, the relationships $L_B < L_R$ and $L_B < L_G$ may be satisfied. In this case, $L_B$ may be equal to zero.

It is more desirable that one reference contact 150 be provided for every four or more pixels. For example, it is assumed that the distance from a pixel G1 that receives a light ray with the second wavelength to a reference contact 150 that is the closest thereto is defined as $L_{G1}$, and the distance from a pixel G2 that receives a light ray with the second wavelength to a reference contact 150 that is the closest thereto is defined as $L_{G2}$. The pixel R, the pixel G1, the pixel G2, and the pixel B are adjacent to one another. By providing one reference contact 150 for every four or more adjacent pixels, the relationships $L_B<L_{G1}$, $L_B<L_{G2}$, and $L_B<L_R$ may be satisfied. This may imply that, in the range of a 2×2 pixel array that forms a Bayer array, only one corresponding reference contact 150 can be provided.

Furthermore, it is more desirable that one reference contact 150 be provided for every five or more pixels, and it is even more desirable that one reference contact 150 be provided for every eight or more pixels. Moreover, one reference contact 150 may be provided for every 10 to 1000 pixels. Providing one reference contact 150 for every M pixels means that, assuming that the number of reference contacts 150 in the pixel circuit region 1 is defined as $M_{RC}$ and the number of pixels provided in the pixel circuit region 1 is defined as $M_P$, $M_{RC}/M_P$ can be made equal to 1/M or close to 1/M. Specifically, the number of reference contacts 150 in the pixel circuit region 1 is smaller than or equal to 1/M of the number of pixels provided in the pixel circuit region 1. M is desirably larger than or equal to 3, and may be 5 or larger, 4 or larger, 8 or larger, 10 or larger, 1000 or smaller. Alternatively, M may be equal to 1 or 2.

It is desirable that the density of the reference contacts 150 disposed in the intermediate region 3 be higher than the density of the reference contacts 150 in the pixel circuit region 1.

The difference in densities of the reference contacts 150 in the intermediate region 3 and the pixel circuit region 1 can be compared based on a ratio $N_{RC}/_{EL}$ of the number $N_{RC}$ of reference contacts 150 to the number $N_{EL}$ of components constituted by the electrode layer 13. A ratio of the number $N_{RC3}$ of reference contacts 150 to the number $N_{EL3}$ of dummy electrodes in the intermediate region 3 is defined as $N_{RC3}/N_{EL3}$. A ratio of the number $N_{RC1}$ of reference contacts 150 to the number $N_{EL1}$ of electrodes in the pixel circuit region 1 is defined as $N_{RC1}/N_{EL1}$. In this case, the ratio $N_{RC3}/N_{EL3}$ can be set to be larger than the ratio $N_{RC1}/N_{EL1}$. When the relationship $N_{RC3}/N_{EL3}>N_{RC1}/N_{EL1}$ is satisfied in a case where the occupancy of the electrode layer 13 is similar between the intermediate region 3 and the pixel circuit region 1, the density of the reference contacts 150 in the intermediate region 3 may be higher than that in the pixel circuit region 1. As mentioned above, a state where the occupancy of the electrode layer 13 is similar between the intermediate region 3 and the pixel circuit region 1 corresponds to when the occupancy of the electrode layer 13 in the intermediate region 3 is between 0.5 times and 1.5 times the occupancy of the electrode layer 13 in the pixel circuit region 1. In the first embodiment, since one reference contact 150 is provided for every four pixels, the number $N_{EL1}$ of gate electrodes in a four-pixel zone of the pixel circuit region 1 is 12, $N_{RC1}=1$, and $N_{RC1}/N_{EL1}=1/12$. On the other hand, in a zone with the same area in the intermediate region 3, the number $N_{EL3}$ of dummy electrodes is 12, $N_{RC3}=46$, and $N_{RC3}/N_{EL3}=46/12$. Therefore, the relationship $N_{RC3}/N_{EL3}>N_{RC1}/N_{EL1}$ is satisfied.

Accordingly, while the density of the reference contacts 150 disposed in the intermediate region 3 is higher than the density of the reference contacts 150 disposed in the pixel circuit region 1, it is desirable that the density of the electrically conductive members 15 disposed in the intermediate region 3 be about the same as the density of the electrically conductive members 15 disposed in the pixel circuit region 1. In addition to the reference contacts 150, the non-reference contacts 151 are provided in the pixel circuit region 1. For example, in a signal generator corresponding to one photoelectric converter, five non-reference contacts 151 are used in addition to reference contacts 150. In the intermediate region 3 where transistors do not need to be provided, at least a part of the occupying area of five non-reference contacts 151 in each signal generator in the intermediate region 3 can be replaced with the reference contacts 150.

Next, other configurations will be described. As shown in FIGS. 3A to 4B, the element isolation layer 12 composed of an insulating material is located in the pixel circuit region 1 and the intermediate region 3. The element isolation layer 12 in the intermediate region 3 can be used as a dummy member. The occupancy of the element isolation layer 12 in the pixel circuit region 1 is defined as $D_{FL1}$, and the occupancy of the element isolation layer 12 in the intermediate region 3 is defined as $D_{FL3}$. The specific layer corresponds to the element isolation layer 12, and the non-specific layer corresponds to the semiconductor layer 11. For example, $D_{FL1}$ is 20%. In this example, with regard to $D_{FL1}$ and $D_{FL3}$, the relationship $0.9 \leq D_{FL3}/D_{FL1} \leq 1.1$ is satisfied.

Furthermore, the electrode layer 13 is located in the pixel circuit region 1 and the intermediate region 3. The electrode layer 13 in the intermediate region 3 can be used as a dummy member. The occupancy of the electrode layer 13 in the pixel circuit region 1 is defined as $D_{EL1}$, and the occupancy of the electrode layer 13 in the intermediate region 3 is defined as $D_{EL3}$. In this case, the specific layer corresponds to the electrode layer 13, and the non-specific layer corresponds to the insulation film 14. For example, $D_{EL1}$ is 25%. In this example, with regard to $D_{EL1}$ and $D_{EL3}$, the relationship $0.9 \leq D_{EL3}/D_{EL1} \leq 1.1$ is satisfied.

Furthermore, multiple electrically conductive members 15 are located in the pixel circuit region 1 and the intermediate region 3. The occupancy of the electrically conductive members 15 in the pixel circuit region 1 is defined as $D_{CP1}$, and the occupancy of the electrically conductive members 15 in the intermediate region 3 is defined as $D_{CP3}$. In this case, the specific layer corresponds to the electrically conductive members 15, and the non-specific layer corresponds to the insulation film 14. In this example, with regard to $D_{CP1}$ and $D_{CP3}$, the relationship $0.8 \leq D_{CP3}/D_{CP1} \leq 1.2$ is satisfied.

Furthermore, the first wiring layer 31 is located in the pixel circuit region 1 and the intermediate region 3. The first wiring layer 31 in the intermediate region 3 can be used as conductive lines that connect the pixel circuits and the peripheral circuits. The occupancy of the first wiring layer 31 in the pixel circuit region 1 is defined as $D_{M11}$, and the occupancy of the first wiring layer 31 in the intermediate region 3 is defined as $D_{M13}$. In this case, the specific layer corresponds to the first wiring layer 31, and the non-specific layer corresponds to the second insulation layer 22. For example, $D_{M11}$ is 25%. In this example, with regard to $D_{M11}$ and $D_{M13}$, the relationship $0.8 \leq D_{M13}/D_{M11} \leq 1.2$ is satisfied.

The second wiring layer 32 is located in the pixel circuit region 1 and the intermediate region 3. The second wiring layer 32 in the intermediate region 3 can be used as conductive lines that connect the pixel circuits and the peripheral circuits. The occupancy of the second wiring layer 32 in the pixel circuit region 1 is defined as $D_{M21}$, and the occupancy of the second wiring layer 32 in the intermediate region 3 is defined as $D_{M23}$. In this case, the specific layer corresponds to the second wiring layer 32, and the non-specific layer corresponds to the third insulation layer 23. For example, $D_{M21}$ is 20%. In this example, with regard to $D_{M21}$ and $D_{M23}$, the relationship $0.8 \leq D_{M23}/D_{M21} \leq 1.2$ is satisfied.

Accordingly, the element isolation layer 12, the electrode layer 13, the first wiring layer 31, and the second wiring layer 32 may serve as specific layers for reducing the difference in densities between the pixel circuit region 1 and the intermediate region 3. Furthermore, it is desirable that the electrically conductive members 15 similarly reduce the difference in densities between the pixel circuit region 1 and the intermediate region 3. In order to achieve this, it is desirable that the occupancy of each layer acting as a specific layer as described above be similar, very similar, extremely similar, or match between the pixel circuit region 1 and the intermediate region 3. Furthermore, it is desirable that the pattern of each layer acting as a specific layer in the pixel circuit region 1 be similar to, very similar to, extremely similar to, or match the pattern thereof in the intermediate region 3.

With the element isolation layer 12, the electrode layer 13, the first wiring layer 31, and the second wiring layer 32 acting as specific layers, the flatness of the non-specific layers located at the same height as these specific layers or the layers above the specific layers can be enhanced. In contrast, in a case where the occupancy of each specific layer greatly differs between the pixel circuit region 1 and the intermediate region 3, as in a reference example to be described below, the flatness of the non-specific layer located at the same height as the specific layer or the layer above the specific layer is lowered.

The cross-sectional structure and the planar structure of an image capturing device 1000 according to a reference example will now be described. FIG. 7A is a cross-sectional view taken along line A-B in FIG. 1, in accordance with the image capturing device 1000 according to the reference example, and corresponds to FIG. 4A. FIG. 7B is a cross-sectional view taken along line C-D in FIG. 1, in accordance with the image capturing device 1000 according to the reference example, and corresponds to FIG. 4B. FIG. 8A illustrates an example of the planar layout of the element isolation layer 12 and the electrode layer 13 in the zone surrounded by the solid line E in FIG. 1, in accordance with the image capturing device 1000 according to the reference example. FIG. 8B illustrates an example of the planar layout of the first wiring layer 31 and the second wiring layer 32 in the zone surrounded by the solid line E in FIG. 1, in accordance with the image capturing device 1000 according to the reference example. Components that are the same as those in the first embodiment are given the same reference characters, and detailed descriptions thereof will be omitted.

In the reference example, the element isolation layer 12 occupies a major portion of the intermediate region 3 except for where openings 1234 and 1235 are provided, and $D_{FL3}$=80%. The occupancy of the element isolation layer 12 in the intermediate region 3 is not similar to that in the pixel circuit region 1. In the intermediate region 3, the electrode layer 13 is not provided except for parts where the gate electrodes 134 of the peripheral circuits are provided, and $D_{EL3} \approx 0$. The occupancy of the electrode layer 13 in the intermediate region 3 is not similar to that in the pixel circuit region 1. Furthermore, in the intermediate region 3, the density of the electrically conductive members 15 is higher than that in the pixel circuit region 1, and, for example, $D_{CP3}/D_{CP1} > 1.5$. The occupancy of the electrically conductive members 15 in the intermediate region 3 is not similar to that in the pixel circuit region 1. The electrically conductive members 15 constitute reference contacts 150 provided in semiconductor regions defined by the openings 1234 and 1235.

Accordingly, when the density of the element isolation layer 12 and/or the electrode layer 13 in the intermediate region 3 is lower than that in the pixel circuit region 1, the upper surface of the insulation film 14 formed at the same level as or above these layers become higher in the pixel circuit region 1 than in the intermediate region 3, possibly causing inclination to occur. This is because the upper surfaces of the element isolation layer 12 and the electrode layer 13 are higher than the surface of the semiconductor layer 11. It is difficult to completely remove such inclination of the insulation film 14 even by performing a planarization process, such as a reflow process, an etch-back process, or a chemical-mechanical planarization (CMP) process, on the insulation film 14. Furthermore, when the density of the electrically conductive members 15 in the intermediate region 3 is higher than that in the pixel circuit region 1, the upper surface of the insulation film 14 formed at the same level as or above these members tends to become higher in the pixel circuit region 1 than in the intermediate region 3. This is because, when the material of the electrically conductive members 15, such as tungsten, embedded in contact holes formed in the insulation film 14 is to be removed by the CMP method, erosion tends to occur where the density of the contact holes is high. Naturally, an insulation layer to be formed above the insulation film 14 with the inclined upper surface would have an upper surface that is inclined in accordance with the aforementioned inclination.

Furthermore, the density of the first wiring layer 31 provided in the intermediate region 3 is higher than that in the pixel circuit region 1. Specifically, the first wiring layer 31 provided in the lower region 302 constitutes the reference signal lines 316, the odd-numbered-column output signal lines 317, the power supply lines 318, and the even-numbered-column output signal lines 319. Furthermore, in the lower region 302, the first wiring layer 31 constitutes local conductive lines 3173 connected to the reference contacts 150. Similar to the first wiring layer 31 in the lower region 302, the first wiring layer 31 is also provided in the upper region 304. Accordingly, the first wiring layer 31 provided in the lower region 302 and the upper region 304 is what causes the occupancy of the first wiring layer 31 in the intermediate region 3 to be higher than that in the pixel circuit region 1. The same applies to the local conductive lines 3153 as the first wiring layer 31 in the left region 301. As a result, for example, since $D_{M13}$=40% and $D_{M13}/D_{M11}$=1.6, the occupancy of the first wiring layer 31 in the intermediate region 3 is not similar to that in the pixel circuit region 1. Moreover, in the intermediate region 3, the density of the second wiring layer 32 constituting a reference signal line 3203 serving as a global conductive line is higher than that in the pixel circuit region 1. For example, since $D_{M23}$=80% and $D_{M23}/D_{M21}$=4.0, the occupancy of the second wiring layer 32 in the intermediate region 3 is not similar to that in the pixel circuit region 1.

The following description relates to a case where the first wiring layer 31 and/or the second wiring layer 32 is/are an aluminum layer or layers. If the density of an aluminum layer in the intermediate region 3 is higher than that in the pixel circuit region 1, the upper surface of an insulation layer that covers the aluminum layer and that is formed at the same level as or above the aluminum layer becomes higher in the intermediate region 3 than in the pixel circuit region 1, possibly causing inclination to occur. This is because the upper surface of the aluminum layer patterned by an etching method is higher than the surface of an underlying insulation layer. It is difficult to completely remove such inclination of the insulation layer that covers the aluminum layer even by performing a planarization process, such as a reflow process, an etch-back process, or a CMP process, on the insulation layer.

The following description relates to a case where the first wiring layer 31 and/or the second wiring layer 32 is/are a copper layer or layers. If the density of a copper layer in the intermediate region 3 is higher than that in the pixel circuit region 1, the upper surface of an insulation layer that covers the copper layer and that is formed at the same level as or above the copper layer becomes lower in the intermediate region 3 than in the pixel circuit region 1, possibly causing inclination to occur. This is because the upper surface of the copper layer patterned by a damascene method tends to erode where the wiring density is high. It is difficult to completely remove such inclination of the insulation layer that covers the copper layer even by performing a planarization process, such as a reflow process, an etch-back process, or a CMP process, on the insulation layer.

As a result, as shown in FIGS. 7A and 7B, the upper surfaces of the insulation layers, such as the insulation film 14 and the interlayer insulation film 20, become inclined. When such inclination occurs, a difference in output signals occurs between the central part and the peripheral part of the pixel circuit region 1 due to various factors. One of the main factors is that, for example, interference between reflected light at the interface between the insulation film 14 and the semiconductor layer 11 and reflected light at the interface between the interlayer insulation film 20 and the passivation film 26 is different between the central part and the peripheral part of the pixel circuit region 1. A difference in height between the central part and the peripheral part of the pixel circuit region 1 occurring due to a normal semiconductor manufacturing process is 100 nm. However, although conditions for interference of visible light depends on the wavelength or the refractive index of a medium, the magnitude of interference is inverted due to a difference in height of about 50 nm to 150 nm in a refractive index range of 1.5 to 2.0 in a wavelength range of 400 nm to 600 nm. This magnitude of interference causes the output from the pixel circuit region 1 to vary. Moreover, when the wavelength at which this interference occurs varies, unevenness of color may occur. Therefore, it is desirable that the difference in height of the upper surfaces of layers provided in the pixel circuit region 1 be smaller than or equal to 50 nm. In order to achieve higher image quality, it is desirable that the difference in height of the upper surfaces of layers provided in the pixel circuit region 1 be smaller than or equal to 25 nm.

In contrast to such a configuration, the occupancy of each specific layer provided in the pixel circuit region 1 is made similar to that in the intermediate region 3 so that the flatness of an overlying layer can be enhanced, whereby a high-quality image capturing process can be achieved.

Next, a second embodiment will be described.

Figure 5A:
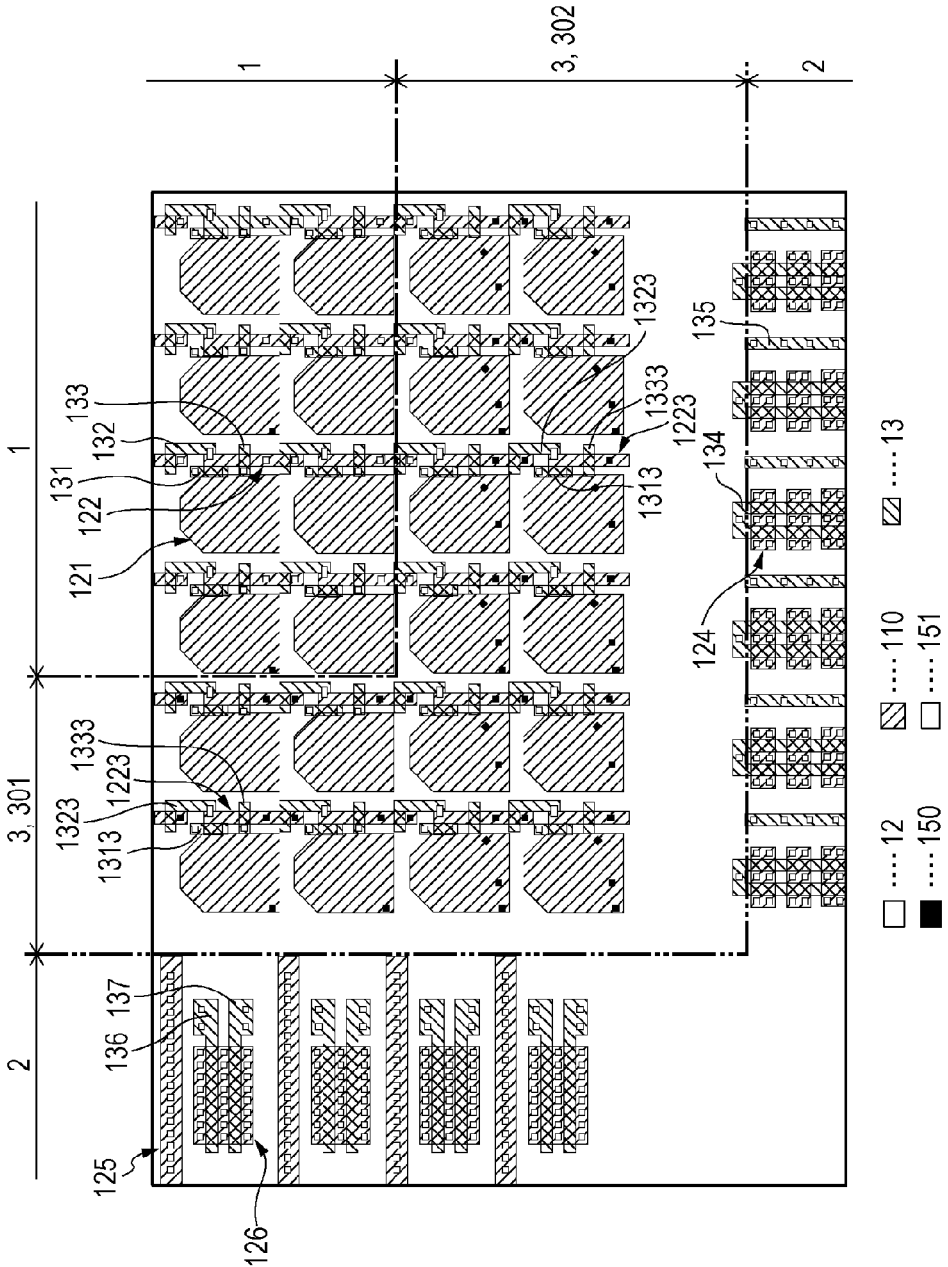
FIGS. 5A and 5B are schematic plan views illustrating an example of the image capturing device.
Figure 5B:
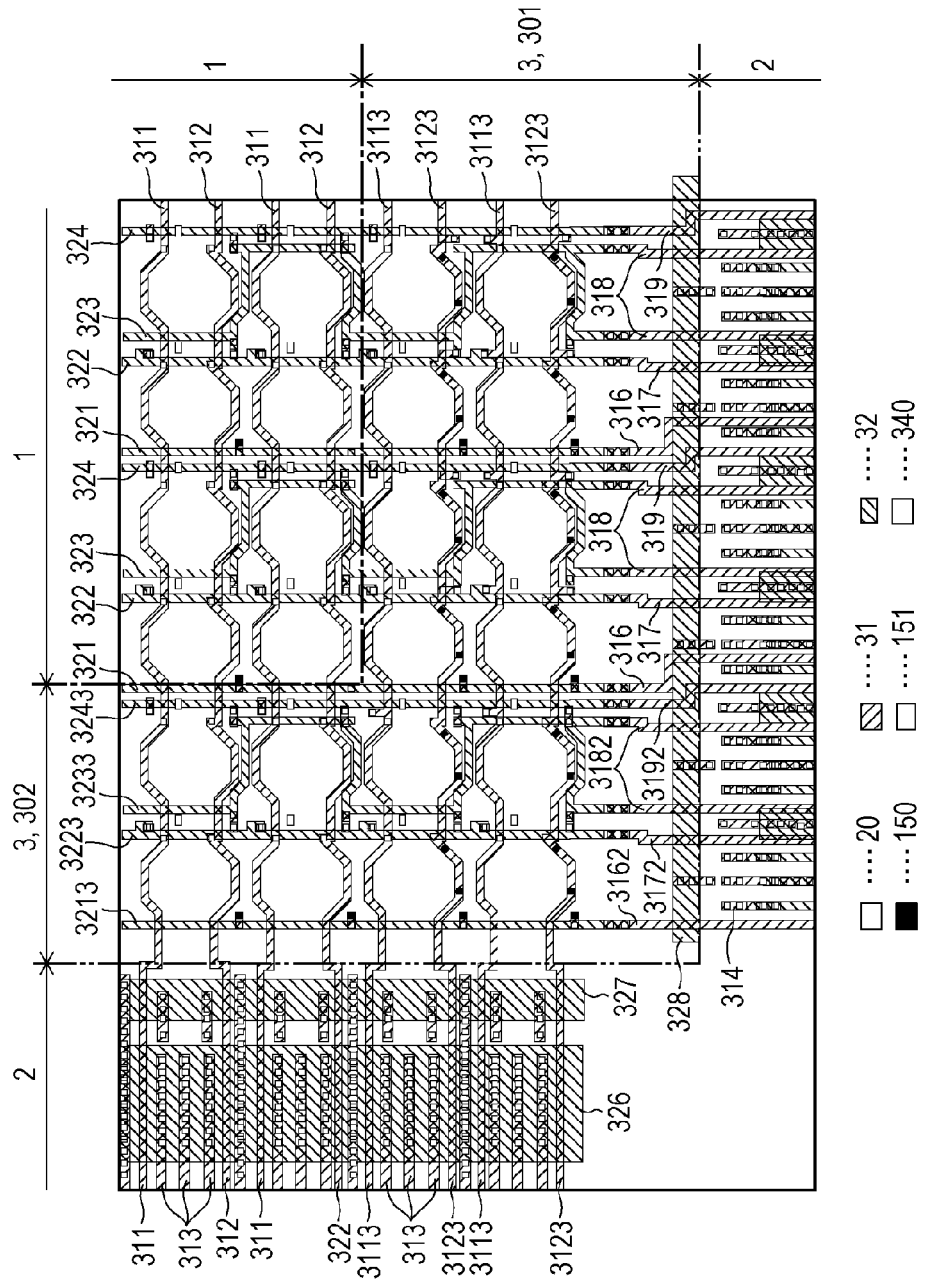

FIG. 5A illustrates an example of the planar layout of the element isolation layer 12 and the electrode layer in the zone surrounded by the solid line E in FIG. 1, in an image capturing device 1000 according to the second embodiment. FIG. 5B illustrates an example of the planar layout of the first wiring layer 31 and the second wiring layer 32 in the zone surrounded by the solid line E in FIG. 1, in the image capturing device 1000 according to the second embodiment.

FIGS. 5A and 5B illustrating the second embodiment respectively correspond to FIGS. 4A and 4B illustrating the first embodiment, and detailed descriptions of common features will be omitted. Furthermore, since the cross-sectional structure of the image capturing device 1000 according to the second embodiment is similar to that shown in FIGS. 3A and 3B illustrating the first embodiment, a description thereof will be omitted.

In the second embodiment, the transfer signal lines 311 and the reset signal lines 312 in the left region 301 each have a meandering shape as in the pixel circuit region 1. Furthermore, the left region 301 is not provided with the local conductive lines 3153 and 3163 provided in the first embodiment, and the reference contacts 150 are provided only by the first wiring layer 31 with a pattern that is the same as that in the pixel circuit region 1. The fifth-type reference signal lines 3113 and the sixth-type reference signal lines 3123 in the lower region 302 each have a meandering shape, similar to the transfer signal lines 311 and the reset signal lines 312 in the pixel circuit region 1. Therefore, in the second embodiment, the pattern of the first wiring layer 31 is similar between the pixel circuit region 1 and the intermediate region 3.

In the second embodiment (FIG. 5A), the shape of the first-type openings 121 and the shape of the first-type openings 1213 are identical to each other (i.e., are the same). The second-type openings 1223 in the intermediate region 3 have a shape that is similar to that of the second-type openings 122 in the pixel circuit region 1.

In the second embodiment, the number $N_{EL1}$ of gate electrodes in a four-pixel zone of the pixel circuit region 1 is 12, $N_{RC1}=1$, and $N_{RC1}/N_{EL1}=1/12$. On the other hand, in a zone with the same area in the intermediate region 3, the number $N_{EL3}$ of dummy electrodes is 12, $N_{RC3}=16$, and $N_{RC3}/N_{EL3}=16/12$. Therefore, the relationship $N_{RC3}/N_{EL3} > N_{RC1}/N_{EL1}$ is satisfied. Furthermore, the number of electrically conductive members 15 in a four-pixel zone is 26 in the pixel circuit region 1 (two of which are for reference contacts 150). In contrast, in the intermediate region 3, in a zone with the same shape and the same area as the four-pixel zone, 24 electrically conductive members 15 are provided (16 of which are for reference contacts 150). Therefore, the relationship $0.8 \leq D_{CP3}/D_{CP1} \leq 1.2$ is satisfied.

Figure 6A:
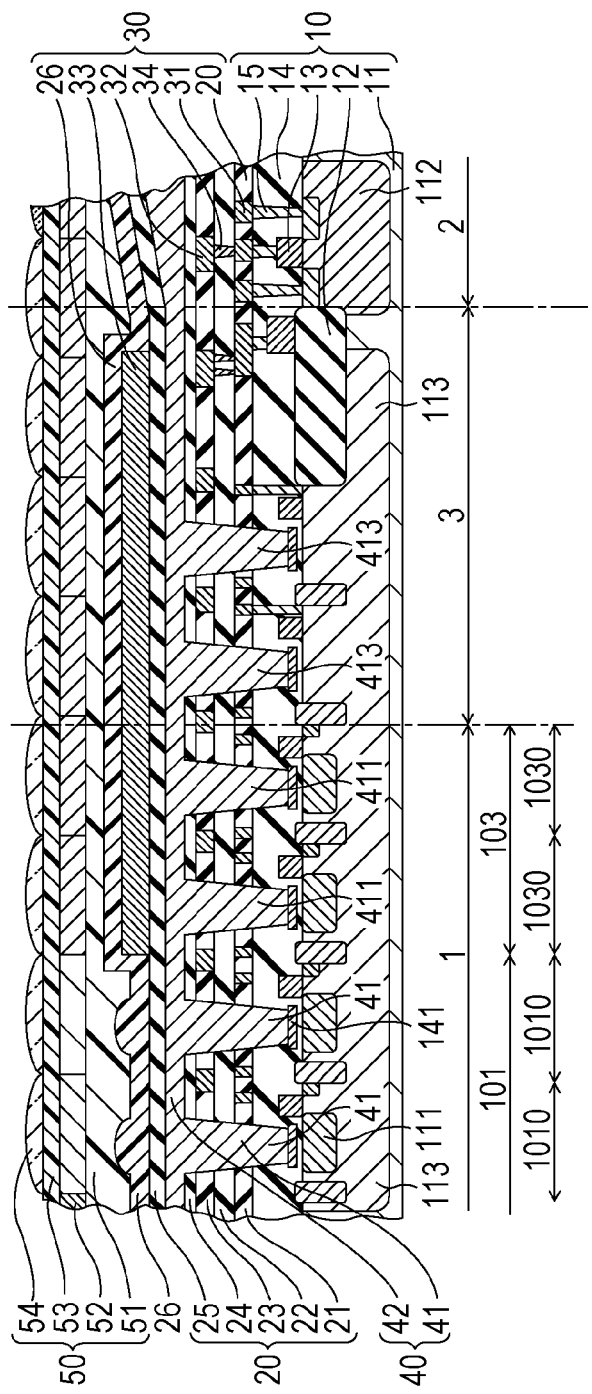
FIGS. 6A and 6B are a schematic cross-sectional view and a schematic plan view, respectively, illustrating an example of the image capturing device.

The cross-sectional structure of an image capturing device 1000 according to a third embodiment will now be described. The third embodiment is different from the first and second embodiments in that the pixel circuit region 1 is provided with a plurality of light guiding paths (optical waveguides). Other points are the same as those in the first and second embodiments, unless otherwise noted. FIG. 6A is a cross-sectional view taken along line A-B in FIG. 1, and corresponds to FIG. 4A. Components that are the same as those in the first embodiment are given the same reference characters.

The pixel circuit region 1 is provided with a plurality of light guides 41 that extend through the interlayer insulation film 20 and that are arranged in correspondence with the photoelectric converters 111. The light guides 41 guide light from the light-transmitting unit 50 toward the photoelectric converters 111. The light guides 41 are constituted by a dielectric member 40. The dielectric member 40 serving as the light guides 41 is a component that is composed of a dielectric material and at least a part of which is surrounded by the insulation layers of the interlayer insulation film 20. Light entering each light guide 41 is reflected at the interface between the light guide 41 and the interlayer insulation film 20 so as to be guided to the corresponding photoelectric converter 111. This can be achieved by using a dielectric material, which has a refractive index and a dielectric constant that are different from those of the insulation layers, as the dielectric member 40 constituting the light guides 41. In particular, it is desirable that the light guides 41 be composed of a dielectric material having a refractive index higher than that of the insulation layers so that total reflection can be made to occur between the insulation layers and the light guides 41. Examples of the dielectric material used for forming the dielectric member 40 include resin, such as polyimide, acrylic, or siloxane, and a silicon compound, such as silicon nitride, silicon oxynitride, or silicon oxide. Alternatively, the light entering each light guide 41 is reflected at the interface between the light guide 41 and a region provided between the light guide 41 and the interlayer insulation film 20 so as to be guided to the corresponding photoelectric converter 111. Examples of a substance constituting the above-mentioned area include a material, such as gas or a porous material, having a refractive index lower than that of the dielectric material used for forming the light guides 41 and a metallic material having metallic luster. If metallic reflection based on metallic luster is to be employed, the refractive index of the dielectric member 40 does not need to be different from the refractive index of the insulation layers surrounding the dielectric member 40.

A connection section 42 that is provided on the interlayer insulation film 20 and that connects the multiple light guides 41 is provided on the light guides 41. The light guides 41 and the connection section 42 are dielectric components composed of the same material. The dielectric member 40 in which the light guides 41 and the connection section 42 are integrated extends continuously across multiple pixels. Alternatively, the connection section 42 may be omitted such that multiple dielectric members 40 serving as the respective light guides 41 are disposed independently for respective pixels.

A fifth insulation layer 25 is provided on the dielectric member 40. The fifth insulation layer 25 is located between the passivation film 26 and the dielectric member 40. The fifth insulation layer 25 has a refractive index lower than that of the passivation film 26. Light entering the fifth insulation layer 25 from the passivation film 26 is collected based on Snell's law and enters the dielectric member 40.

In addition to the light-receiving pixel region 101, the first reference pixel region 102 and the second reference pixel region 103 in the pixel circuit region 1 are also provided with dummy light guides 411 composed of the same dielectric material as the light guides 41. The dummy light guides 411 in the first reference pixel region 102 and the second reference pixel region 103 extend to the same depth as the light guides 41. Therefore, the dummy light guides 411 completely extend through the insulation layers through which the light guides 41 in the light-receiving pixel region 101 extend. By providing the dummy light guides 411 in the first reference pixel region 102 and the second reference pixel region 103 that originally do not need to guide light, the noise level of a reference signal used for signal processing can be made closer to the noise level in the light-receiving pixel region 101.

In the third embodiment, in addition to the pixel circuit region 1, the intermediate region 3 is also provided with dummy light guides 413 composed of the same dielectric material as the light guides 41. The dummy light guides 413 in the intermediate region 3 extend to the same depth as the light guides 41. Therefore, the dummy light guides 413 completely extend through the insulation layers through which the light guides 41 in the pixel circuit region 1 extend.

Consequently, the dielectric member 40 that extends through an arbitrary insulation layer is located in the pixel circuit region 1 and the intermediate region 3. It is assumed that the occupancy of the dielectric member 40, which constitutes the light guides 41, the dummy light guides 411, and the dummy light guides 413 and extends through the insulation layers in the pixel circuit region 1, is defined as $D_{LG1}$, and the occupancy of the dielectric member 40 in the intermediate region 3 is defined as $D_{LG3}$. In this case, the specific layer corresponds to the dielectric member 40, and the non-specific layer corresponds to an insulation layer through which the light guides 41 extend.

With regard to $D_{LG1}$ and $D_{LG3}$, it is desirable that the relationship $0.50 \leq D_{LG3}/D_{LG1} \leq 1.50$ (6a) be satisfied. It is more desirable that the relationship $0.90 \leq D_{LG3}/D_{LG1} \leq 1.10$ (6b) be satisfied.

The matching rate between the planar layout of the dielectric member 40, which constitutes the light guides 41, the dummy light guides 411, and the dummy light guides 413, in the pixel circuit region 1 and the planar layout thereof in the intermediate region 3 is desirably 50% or higher. The matching rate is more desirably 75% or higher, even more desirably 90% or higher, and most desirably 100%.

The light guides 41 and the dummy light guides 411 and 413 are formed as a result of the following process. First, multiple holes extending through multiple insulation layers of the interlayer insulation film 20 are formed therein. The dielectric member 40 is formed by embedding a dielectric material into these holes. The upper surface of the dielectric member 40 embedded in the holes undergo a planarization process, where necessary.

Figure 6B:
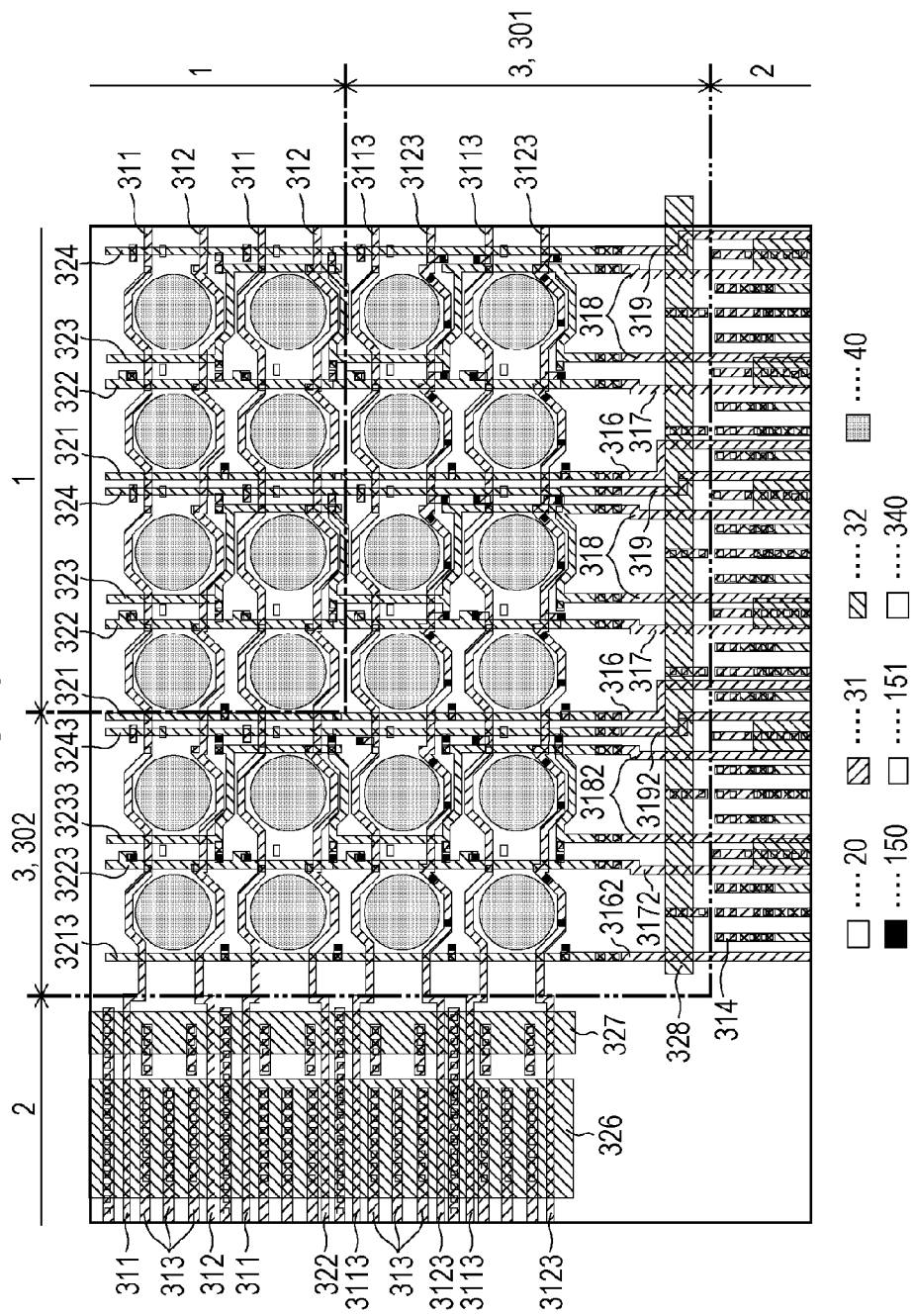

FIG. 6B illustrates an example of the planar layout of the dielectric member 40 constituting the dummy light guides 411 (or the light guides 41) and the dummy light guides 413 in the zone surrounded by the solid line E in FIG. 1, in the image capturing device 1000 according to the third embodiment. In FIG. 6B, the layouts of the first wiring layer 31 and the second wiring layer 32 are also shown. The planar layout of the dielectric member 40 constituting the dummy light guides 411 and 413 in the pixel circuit region 1 is identical to the planar layout thereof in the intermediate region 3. The size and the shape of each dummy light guide 411 (and each light guide 41) are identical to those of each dummy light guide 413. Moreover, the array pitch of the multiple dummy light guides 411 is the same as the array pitch of the multiple dummy light guides 413. As described in the first and second embodiments, this configuration can be achieved by making the patterns of the first wiring layer 31 and the second wiring layer 32 similar, very similar, extremely similar, or match between the pixel circuit region 1 and the intermediate region 3. Thus, in the intermediate region 3, the dummy light guides 413 do not interfere with the first wiring layer 31 and the second wiring layer 32. Consequently, the arrangement of the dummy light guides 413 can be made similar, very similar, extremely similar, or identical to those of the light guides 41 and the dummy light guides 413.

According to each of the above-described embodiments, an image capturing device that can obtain a high-quality image can be provided.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2013-212297 filed Oct. 9, 2013, which is hereby incorporated by reference herein in its entirety.

What is claimed is:

1. An image capturing device comprising:
a pixel circuit region in which a plurality of pixel circuits are arranged in a matrix;
a peripheral circuit region that is located on a periphery of the pixel circuit region and in which a peripheral circuit is arranged; and
an intermediate region that is located between the pixel circuit region and the peripheral circuit region and that forms a boundary with the pixel circuit region and the peripheral circuit region,
wherein the pixel circuit region, the peripheral circuit region, and the intermediate region are provided with a semiconductor layer, a first wiring layer located on the semiconductor layer, and a second wiring layer located away from the semiconductor layer relative to the first wiring layer, and the pixel circuits and the peripheral circuit are connected via one of at least the first wiring layer and the second wiring layer in the intermediate region, and wherein an area occupancy of the one wiring layer in the intermediate region relative to a total area of the intermediate region is between 0.5 times and 1.5 times an area occupancy of the one wiring layer in the pixel circuit region relative to a total area of the pixel circuit region.

2. The image capturing device according to claim 1, wherein the intermediate region is provided with a contact for supplying reference potential of the pixel circuits.

3. The image capturing device according to claim 2, wherein the one wiring layer includes a conductive line that extends across the pixel circuit region from the intermediate region and that supplies the reference potential.

4. The image capturing device according to claim 2, wherein the other one of the first wiring layer and the second wiring layer includes a conductive line that extends across the pixel circuit region from the intermediate region and that supplies the reference potential.

5. The image capturing device according to claim 1, wherein the one wiring layer is the second wiring layer.

6. The image capturing device according to claim 1, wherein an area occupancy of the second wiring layer in the intermediate region relative to the total area of the intermediate region is lower than an area occupancy of the first wiring layer in the intermediate region relative to the total area of the intermediate region.

7. The image capturing device according to claim 1, wherein an area occupancy of the first wiring layer in the intermediate region relative to the total area of the intermediate region is between 0.7 times and 1.3 times an area occupancy of the first wiring layer in the pixel circuit region relative to the total area of the pixel circuit region.

8. The image capturing device according to claim 1, wherein, in the intermediate region, a conductive line constituted by the first wiring layer and a conductive line constituted by the second wiring layer intersect with each other at multiple locations.

9. The image capturing device according to claim 1, wherein a zone that includes at least one of the plurality of pixel circuits in the pixel circuit region is defined as a first zone, and a zone in the intermediate region that has a contour that is the same as a contour of the first zone is defined as a second zone, and wherein the one wiring layer is located in the first zone and the second zone, and a matching rate between a pattern of the one wiring layer in the second zone and a pattern of the one wiring layer in the first zone is 50% or higher.

10. The image capturing device according to claim 9, wherein the pixel circuit region, the peripheral circuit region, and the intermediate region are provided with an insulation film that is located between the first wiring layer and the semiconductor layer and through which an electrically conductive member connected to the semiconductor layer extends, wherein the pixel circuit region, the peripheral circuit region, and the intermediate region are provided with an electrode layer located between the insulation film and the semiconductor layer, and the electrode layer constitutes electrodes of the pixel circuits in the pixel circuit region and constitutes an electrode of the peripheral circuit in the peripheral circuit region, and wherein the electrode layer is located in the first zone and the second zone, and a matching rate between a pattern of the electrode layer in the second zone and a pattern of the electrode layer in the first zone is 50% or higher.

11. The image capturing device according to claim 1, wherein the area occupancy of the one wiring layer located in the intermediate region relative to the total area of the intermediate region is lower than an area occupancy of the one wiring layer in the peripheral circuit region relative to a total area of the peripheral circuit region.

12. The image capturing device according to claim 1, wherein the pixel circuit region, the peripheral circuit region, and the intermediate region are provided with an insulation film that is located between the first wiring layer and the semiconductor layer and through which an electrically conductive member connected to the semiconductor layer extends, wherein the pixel circuit region, the peripheral circuit region, and the intermediate region are provided with an electrode layer located between the insulation film and the semiconductor layer, and the electrode layer constitutes electrodes of the pixel circuits in the pixel circuit region and constitutes an electrode of the peripheral circuit in the peripheral circuit region, and wherein an area occupancy of the electrode layer located in the intermediate region relative to the total area of the intermediate region is between 0.5 times and 1.5 times an area occupancy of the electrode layer located in the pixel circuit region relative to the total area of the pixel circuit region.

13. The image capturing device according to claim 12, wherein an area occupancy of the electrically conductive member located in the intermediate region relative to the total area of the intermediate region is between 0.5 times and 1.5 times an area occupancy of the electrically conductive member located in the pixel circuit region relative to the total area of the pixel circuit region.

14. The image capturing device according to claim 12, wherein the pixel circuit region and the intermediate region are provided with a dielectric member that extends through an insulation layer located on the semiconductor layer, and wherein an area occupancy of the dielectric member located in the intermediate region relative to the total area of the intermediate region is between 0.5 times and 1.5 times an area occupancy of the dielectric member located in the pixel circuit region relative to the total area of the pixel circuit region.

15. The image capturing device according to claim 14, wherein the insulation layer is located between the first wiring layer and the second wiring layer, and a dielectric constant of the dielectric member is higher than a dielectric constant of the insulation layer.

16. The image capturing device according to claim 15, wherein the pixel circuit region, the peripheral circuit region, and the intermediate region are provided with an element isolation layer located between the insulation film and the semiconductor layer, and wherein an area occupancy of the element isolation layer in the intermediate region is between 0.5 times and 1.5 times an area occupancy of the element isolation layer in the pixel circuit region.

17. The image capturing device according to claim 1, wherein the pixel circuit region, the peripheral circuit region, and the intermediate region are provided with an insulation film that is located between the one wiring layer and the semiconductor layer and through which an electrically conductive member connected to the semiconductor layer extends, wherein the pixel circuit region, the peripheral circuit region, and the intermediate region are provided with an element isolation layer located between the insulation film and the semiconductor layer, and wherein an area occupancy of the element isolation layer located in the intermediate region relative to the total area of the intermediate region is between 0.5 times and 1.5 times an area occupancy of the element isolation layer located in the pixel circuit region relative to the total area of the pixel circuit region.

18. The image capturing device according to claim 1, wherein the pixel circuit region, the peripheral circuit region, and the intermediate region are provided with an insulation film that is located between the one wiring layer and the semiconductor layer and through which an electrically conductive member connected to the semiconductor layer extends, wherein the pixel circuit region, the peripheral circuit region, and the intermediate region are provided with an element isolation layer located between the insulation film and the semiconductor layer, wherein a zone that includes at least one of the plurality of pixel circuits in the pixel circuit region is defined as a first zone, and a zone in the intermediate region that has a contour that is the same as a contour of the first zone is defined as a second zone, and wherein the element isolation layer is located in the first zone and the second zone, and a matching rate between a pattern of the element isolation layer in the intermediate region and a pattern of the element isolation layer in the pixel circuit region is 50% or higher.

19. The image capturing device according to claim 1, wherein a distance between the pixel circuit region and the peripheral circuit region with the intermediate region interposed therebetween is between 10 μm and 100 μm.

20. An image capturing device comprising:

a pixel circuit region in which a plurality of pixel circuits are arranged in a matrix;

a peripheral circuit region that is located on a periphery of the pixel circuit region and in which a peripheral circuit is arranged; and an intermediate region that is located between the pixel circuit region and the peripheral circuit region and that forms a boundary with the pixel circuit region and the peripheral circuit region, wherein the pixel circuit region, the peripheral circuit region, and the intermediate region are provided with an insulation film that is located on a semiconductor layer and through which an electrically conductive member connected to the semiconductor layer extends, wherein the pixel circuit region, the peripheral circuit region, and the intermediate region are provided with an electrode layer located between the insulation film and the semiconductor layer, and the electrode layer constitutes electrodes of the pixel circuits in the pixel circuit region, constitutes an electrode of the peripheral circuit in the peripheral circuit region, and constitutes a dummy electrode in the intermediate region, wherein the pixel circuit region and the intermediate region are provided with contacts for supplying reference potential to the semiconductor layer via the electrically conductive member, and the number of contacts in the pixel circuit region is one-third or smaller of the number of pixels provided in the pixel circuit region, wherein a ratio of the number of contacts to the number of dummy electrodes in the intermediate region is larger than a ratio of the number of contacts to the number of electrodes in the pixel circuit region, and wherein an area occupancy of the electrode layer in the intermediate region is between 0.5 times and 1.5 times an area occupancy of the electrode layer in the pixel circuit region.

\* \* \* \* \*